(12) United States Patent
Chen et al.

(10) Patent No.: US 11,791,204 B2
(45) Date of Patent: Oct. 17, 2023

(54) SEMICONDUCTOR DEVICE WITH CONNECTING STRUCTURE HAVING A DOPED LAYER AND METHOD FOR FORMING THE SAME

(71) Applicant: Taiwan Semiconductor Manufacturing Co., Ltd., Hsinchu (TW)

(72) Inventors: Kuo-Ju Chen, Taichung (TW); Chun-Hsien Huang, Hsinchu (TW); Su-Hao Liu, Jhongpu Township (TW); Liang-Yin Chen, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 99 days.

(21) Appl. No.: 17/171,210

(22) Filed: Feb. 9, 2021

(65) Prior Publication Data

US 2021/0327818 A1 Oct. 21, 2021

Related U.S. Application Data

(60) Provisional application No. 63/013,179, filed on Apr. 21, 2020.

(51) Int. Cl.
*H01L 21/768* (2006.01)
*H01L 23/532* (2006.01)
(Continued)

(52) U.S. Cl.
CPC .. *H01L 21/76825* (2013.01); *H01L 21/76816* (2013.01); *H01L 21/76822* (2013.01); *H01L 21/76883* (2013.01); *H01L 21/76886* (2013.01); *H01L 23/5226* (2013.01); *H01L 23/5283* (2013.01); *H01L 23/53242* (2013.01); *H01L 23/53295* (2013.01)

(58) Field of Classification Search
CPC ................ H01L 21/76825; H01L 21/76883
See application file for complete search history.

(56) References Cited

U.S. PATENT DOCUMENTS 7,183,629 B2 * 2/2007 Engelmann ....... H01L 21/76832
257/E21.576
8,192,805 B2 * 6/2012 Russell ................. H01L 29/518
427/523
(Continued)

FOREIGN PATENT DOCUMENTS

CN 109427734 A 3/2019
DE 102019112264 A1 3/2020
(Continued)

*Primary Examiner* — Daniel Luke
(74) *Attorney, Agent, or Firm* — Slater Matsil, LLP

(57) ABSTRACT

A connecting structure includes a first dielectric layer disposed over a substrate and a conductive feature, a doped dielectric layer disposed over the first dielectric layer, a first metal portion disposed in the first dielectric layer and in contact with the conductive feature, and a doped metal portion disposed over the first metal portion. The first metal portion and the doped metal portion include a same noble metal material. The doped dielectric layer and the doped metal portion include same dopants.

17 Claims, 30 Drawing Sheets

(51) Int. Cl.
*H01L 23/522* (2006.01)
*H01L 23/528* (2006.01)

(56) References Cited

U.S. PATENT DOCUMENTS

| | | | | |
|---|---|---|---|---|
| 8,358,007 | B2* | 1/2013 | Sohn | H01L 23/53238 |
| | | | | 438/692 |
| 8,692,376 | B2* | 4/2014 | Kim | H01L 21/76883 |
| | | | | 257/770 |
| 9,899,327 | B2* | 2/2018 | Yang | H01L 23/53238 |
| 9,911,698 | B1* | 3/2018 | Yang | H01L 21/76825 |
| 2018/0166329 | A1 | 6/2018 | Huang et al. | |
| 2019/0157135 | A1 | 5/2019 | Ku et al. | |
| 2019/0157148 | A1* | 5/2019 | Hsieh | H01L 21/823821 |
| 2019/0305107 | A1 | 10/2019 | Chen et al. | |
| 2019/0371664 | A1* | 12/2019 | Wu | H01L 21/7684 |
| 2020/0006083 | A1 | 1/2020 | Huang et al. | |
| 2020/0006127 | A1 | 1/2020 | Khaderbad et al. | |
| 2020/0035549 | A1 | 1/2020 | Wu | |
| 2020/0098591 | A1* | 3/2020 | Lin | H01L 21/76805 |
| 2021/0264959 | A1 | 8/2021 | Rabkin et al. | |

FOREIGN PATENT DOCUMENTS

| | | | |
|---|---|---|---|
| KR | 20200035841 | A | 4/2020 |
| TW | 201923869 | A | 6/2019 |
| TW | 201942977 | A | 11/2019 |
| TW | 202002113 | A | 1/2020 |
| TW | 202008511 | A | 2/2020 |
| TW | 202013537 | A | 4/2020 |
| TW | 202013602 | A | 4/2020 |

\* cited by examiner

SEMICONDUCTOR DEVICE WITH CONNECTING STRUCTURE HAVING A DOPED LAYER AND METHOD FOR FORMING THE SAME

PRIORITY DATA

This patent claims the benefit of U.S. Provisional Patent Application No. 63/013,179 filed Apr. 21, 2020, the entire disclosure of which is hereby incorporated by reference.

BACKGROUND

The semiconductor integrated circuit (IC) industry has experienced rapid growth. Technological advances in IC materials and design have produced continuous improvements in succeeding generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and reducing associated costs.

However, as the feature sizes continue to decrease, fabrication processes continue to become more difficult to perform. Thus, there is a challenge to form reliable semiconductor devices with smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
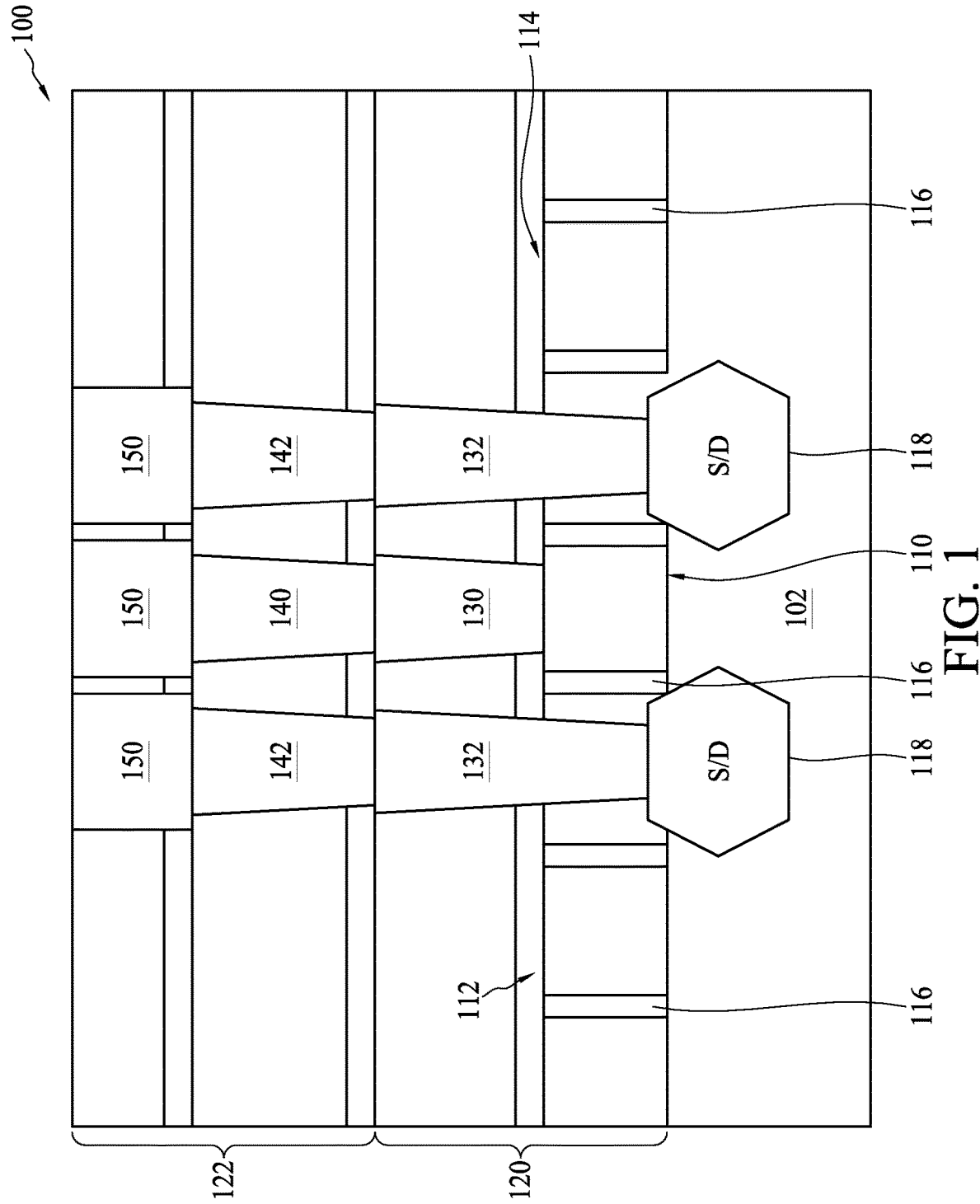
FIG. 1 is a fragmentary cross-sectional view of a semiconductor structure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

IC manufacturing process flow can typically be divided into three categories: front-end-of-line (FEOL), middle-end-of-line (MEOL) and back-end-of-line (BEOL). FEOL generally encompasses processes related to fabrication of IC devices, such as transistors. For example, FEOL processes can include forming isolation structures for isolating IC devices, gate structures, and source and drain structures (also referred to as source/drain structures) that form a transistor. MEOL generally encompasses processes related to fabrication of connecting structures (also referred to as contacts or plugs) that connect to conductive features (or conductive regions) of the IC devices. For example, MEOL processes can include forming connecting structures that connect to the gate structures and connecting structures that connect to the source/drain structures. BEOL generally encompasses processes related to fabrication of multilayer interconnect (MLI) structures that electrically connect the IC devices and the connecting structures fabricated by FEOL and MEOL. Accordingly, operation of the IC devices can be enabled. As mentioned above, the scaling-down processes have increased the complexity of processing and manufacturing ICs. For example, in some comparative approaches, ruthenium (Ru), which has low resistivity, is used to form the connecting structures formed by MEOL in order to reduce plug contact resistance, but the Ru-containing connecting structure has presented yield and cost challenges as the connecting structures become more compact with ever-shrinking IC feature size.

Embodiments such as those described herein provide a connecting structure and a method for forming a connecting structure to mitigate a bottom metal-loss issue that may occur from metal diffusing from a lower metal layer during an anneal. In some embodiments, an ion implantation is performed after depositing a metal layer to form a barrier layer within the conductive material. In some embodiments, ions implanted into the conductive material are bonded to the conductive material to form the diffusion barrier layer, such that metal diffusion can be obstructed or reduced by the diffusion barrier layer. Accordingly, the bottom metal-loss issue caused by metal diffusion can be mitigated or reduced.

FIG. 1 is a fragmentary cross-sectional view of a semiconductor structure 100, in portion or entirety, according to various aspects of some embodiments. The semiconductor structure 100 can be included in a microprocessor, a memory, and/or another IC device. In some embodiments, the semiconductor structure 100 is a portion of an IC chip, a system on chip (SoC), or a portion thereof, that includes various passive and active microelectronic devices, such as resistors, capacitors, inductors, diodes, p-type field-effect transistors (PFETs), n-type field-effect transistors (NFETs), metal-oxide semiconductor field effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, other suitable components, or combinations thereof. The transistors may be planar transistors or multi-gate transistors, such as fin-like FETs (FinFETs). FIG. 1 has been simplified for the sake of clarity to better illustrate features of some embodiments. Additional features can be added in the semiconductor structure 100, and some of the features described below can be replaced, modified, or eliminated in other embodiments of the semiconductor structure 100.

In some embodiments, the semiconductor structure 100 includes a substrate (e.g., wafer) 102. In some embodiments, the substrate 102 includes silicon. Alternatively or additionally, the substrate 102 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate 102 includes one or more group III-V materials, one or more group II-IV materials, or combinations thereof. In some implementations, the substrate 102 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 102 can include various doped regions (not shown) configured according to design requirements of a device, such as p-type doped regions, n-type doped regions, or combinations thereof. P-type doped regions (for example, p-type wells) include p-type dopants, such as boron, indium, another p-type dopant, or a combination thereof. N-type doped regions (for example, n-type wells) include n-type dopants, such as phosphorus, arsenic, another n-type dopant, or a combination thereof. In some implementations, the substrate 102 includes doped regions formed with a combination of p-type dopants and n-type dopants. The various doped regions can be formed directly on and/or in the substrate 102, for example, providing a p-well structure, an n-well structure, a dual-well structure, a raised structure, or a combination thereof. An ion implantation process, a diffusion process, and/or another suitable doping process can be performed to form the various doped regions.

Isolations (not shown) can be formed over and/or in the substrate 102 to electrically isolate various regions, such as various device regions, of the semiconductor structure 100. For example, the isolations can define and electrically isolate active device regions and/or passive device regions from each other. The isolations can include silicon oxide, silicon nitride, silicon oxynitride, another suitable isolation material, or a combination thereof. Isolation features can include different structures, such as shallow trench isolation (STI) structures, deep trench isolation (DTI) structures, and/or local oxidation of silicon (LOCOS) structures.

Various gate structures can be disposed over the substrate 102, such as gate structures 110, 112 and 114. In some embodiments, one or more gate structures 110, 112 and 114 can interpose a source region and a drain region, where a channel region is defined between the source region and the drain region. In some embodiments, the gate structures 110, 112 and 114 are formed over a fin structure. In some embodiments, the gate structures 110, 112 and 114 include a metal gate structure. In some embodiments, the metal gate structure includes a gate dielectric layer and a gate electrode. The gate dielectric layer can be disposed over the substrate 102, and the gate electrode is disposed on the gate dielectric layer. The gate dielectric layer includes a dielectric material, such as silicon oxide, high-k dielectric material, another suitable dielectric material, or a combination thereof. High-k dielectric material generally refers to dielectric materials having a high dielectric constant, for example, a dielectric constant greater than that of silicon oxide (k≈3.9). Exemplary high-k dielectric materials include hafnium, aluminum, zirconium, lanthanum, tantalum, titanium, yttrium, oxygen, nitrogen, another suitable constituent, or a combination thereof. In some embodiments, the gate dielectric layer includes a multilayer structure, such as an interfacial layer (IL) including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, another suitable high-k dielectric material, or a combination thereof.

The gate electrode includes an electrically-conductive material. In some implementations, the gate electrode includes multiple layers, such as one or more work function metal layers and gap-filling metal layers. The work function metal layer includes a conductive material tuned to have a desired work function (such as an n-type work function or a p-type work function), such as an n-type work function material and/or a p-type work function material. P-type work function materials include TiN, TaN, Ru, Mo, Al, WN, $ZrSi_2$, $MoSi_2$, $TaSi_2$, $NiSi_2$, WN, other p-type work function materials, and combinations thereof. N-type work function materials include Ti, Al, Ag, Mn, Zr, TiAl, TiAlC, TaC, TaCN, TaSiN, TaAl, TaAlC, TiAlN, other n-type work function materials, and combinations thereof. The gap-filling metal layer can include a suitable conductive material, such as Al, W, and/or Cu.

The gate structures 110, 112 and 114 can further include spacers 116, which are disposed adjacent to (for example, along sidewalls of) the gate structures 110, 112 and 114. The spacers 116 can be formed by any suitable process and include a dielectric material. The dielectric material can include silicon, oxygen, carbon, nitrogen, another suitable material, or a combination thereof (for example, silicon oxide, silicon nitride, silicon oxynitride, or silicon carbide). In some embodiments, the spacers 116 can include a multilayer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate structures 110, 112 and 114.

Implantation, diffusion, and/or annealing processes can be performed to form lightly-doped source and drain (LDD) features and/or heavily-doped source and drain (HDD) features in the substrate 102 before and/or after the forming of the spacers 116.

In some embodiments, source/drain regions S/D of the device can include epitaxial structures 118. For example, a semiconductor material is epitaxially grown on the substrate 102, forming epitaxial source/drain structures 118 over a source region and a drain region of the substrate 102. Accordingly, the gate structure no, the epitaxial source/drain structure 118 and a channel region defined between the epitaxial source/drain structures 118 form a device such as a transistor. In some embodiments, the epitaxial source/drain structures 118 can surround source/drain regions of a fin structure. In some embodiments, the epitaxial source/drain structures 118 can replace portions of the fin structure. The epitaxial source/drain structures 118 are doped with n-type dopants and/or p-type dopants. In some embodiments, where the transistor is configured as an n-type device (for example, having an n-channel), the epitaxial source/drain structure 118 can include silicon-containing epitaxial layers or silicon-carbon-containing epitaxial layers doped with phosphorous, another n-type dopant, or combinations thereof (for example, forming Si:P epitaxial layers or Si:C:P epitaxial layers). In alternative embodiments, where the transistor is configured as a p-type device (for example, having a p-channel), the epitaxial source/drain structures 118 can include silicon-and-germanium-containing epitaxial layers doped with boron, another p-type dopant, or combinations thereof (for example, forming Si:Ge:B epitaxial layers). In some embodiments, the epitaxial source/drain structures 118 include materials and/or dopants that achieve desired tensile stress and/or compressive stress in the channel region.

As shown in FIG. 1, a plurality of dielectric layers 120 and 122 can be disposed over the substrate 102. The dielectric layers 120 and 122 can each include one or more layers of a dielectric material including, for example, silicon oxide, silicon nitride, silicon oxynitride, TEOS formed oxide, PSG, BPSG, low-k dielectric material, another suitable dielectric material, or combinations thereof. Exemplary low-k dielectric materials include FSG, carbon-doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric materials, and combinations thereof. As shown in FIG. 1, the dielectric layer 120 may cover the source/drain region S/D, the spacers 116 and the gate structures 110, 112 and 114. In some embodiments, the dielectric layer 120 may be referred to as an interlayer dielectric (ILD) layer. In some embodiments, the dielectric layer 122 may be referred to as an interlayer dielectric (ILD) layer or an inter-metal dielectric (IMD) layer.

In some embodiments, one or more connecting structures 130, 132 can be formed over the source/drain region S/D and the gate structure 110, as shown in FIG. 1. The connecting structure 130 is disposed on the gate structure 110, such that the gate structure 110 can be connected to a back-end-of-line (BEOL) interconnection (not shown) through the connecting structure 130. The connecting structure 132 can be referred to as a metal-to-drain (MD) contact, which generally refers to a contact to the source/drain regions S/D. As shown in FIG. 1, the connecting structures 132 can be disposed on the epitaxial source/drain structures 118, respectively, such that the epitaxial source/drain structures 118 can be connected to the BEOL interconnection through the connecting structures 132. Accordingly, the FEOL structures can be electrically connected to the BEOL interconnection through the connecting structures 130, 132, which can also be referred to as the MEOL interconnect structures.

Still referring to FIG. 1, connecting structures 140, 142 can be formed on the connecting structures 130, 132, and conductive features 150 can be formed on the connecting structures 140, 142. The connecting structures 140, 142 electrically connect the connecting structure 130, 132 to the conductive features 150. In some embodiments, the connecting structures 140, 142 are referred to as vias (V) and the conductive features 150 are referred to as metal lines (M) in the BEOL interconnection. In some embodiments, the BEOL interconnection includes a dielectric stack including the dielectric layers 120 and 122, and vias and metal lines are formed in the dielectric stack.

Figure 2:
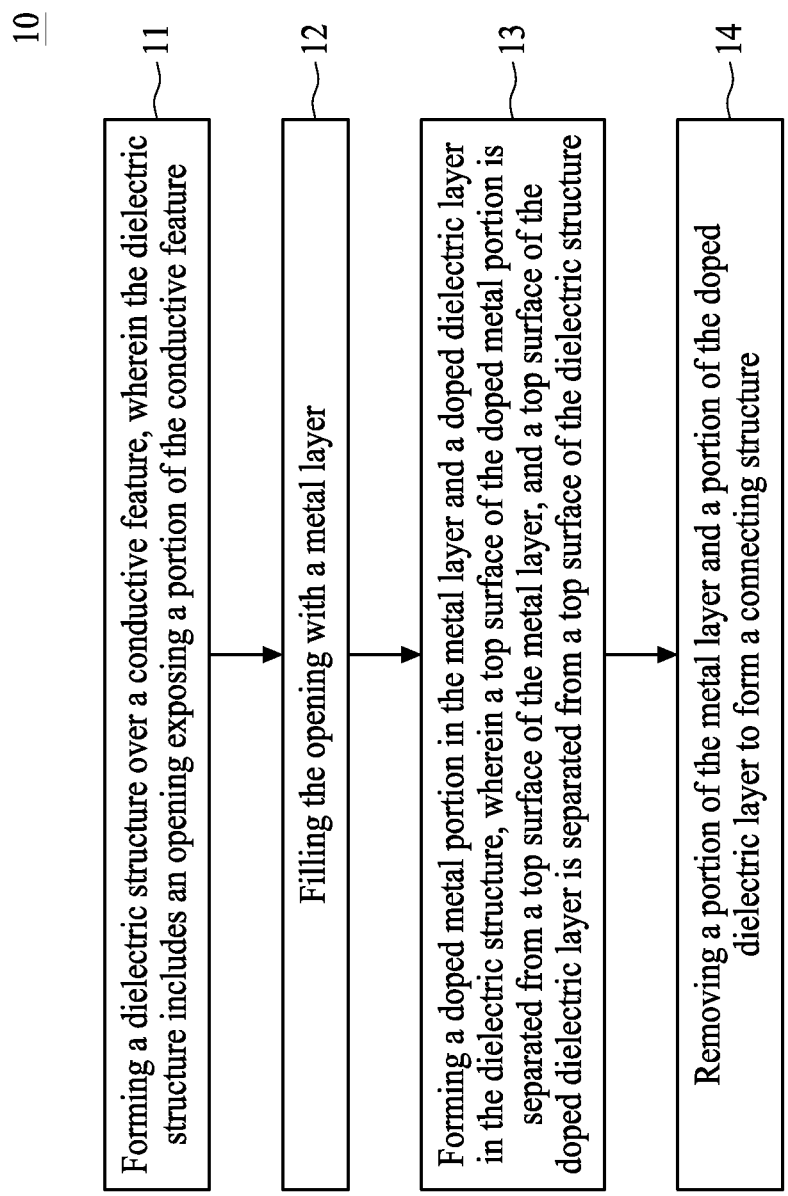
FIG. 2 is a flowchart of a method for forming a connecting structure according to various aspects of the present disclosure.

FIG. 2 is a flowchart representing a method for forming a connecting structure 10 according to aspects of the present disclosure. In some embodiments, the method for forming the connecting structure 10 includes a number of operations (11, 12, 13 and 14). The method for forming the connecting structure 10 will be further described according to one or more embodiments. It should be noted that the operations of the method for forming the connecting structure 10 may be rearranged or otherwise modified within the scope of the various aspects. It should further be noted that additional processes may be provided before, during, and after the method 10, and that some other processes may be only briefly described herein. In some embodiments, the method for forming the connecting structure 10 can be used to form the connecting structure 130, 132 in the MEOL structure. In other embodiments, the method for forming the connecting structure 10 can be used to form the connecting structure 140, 142 in the BEOL interconnection.

Figure 3A:
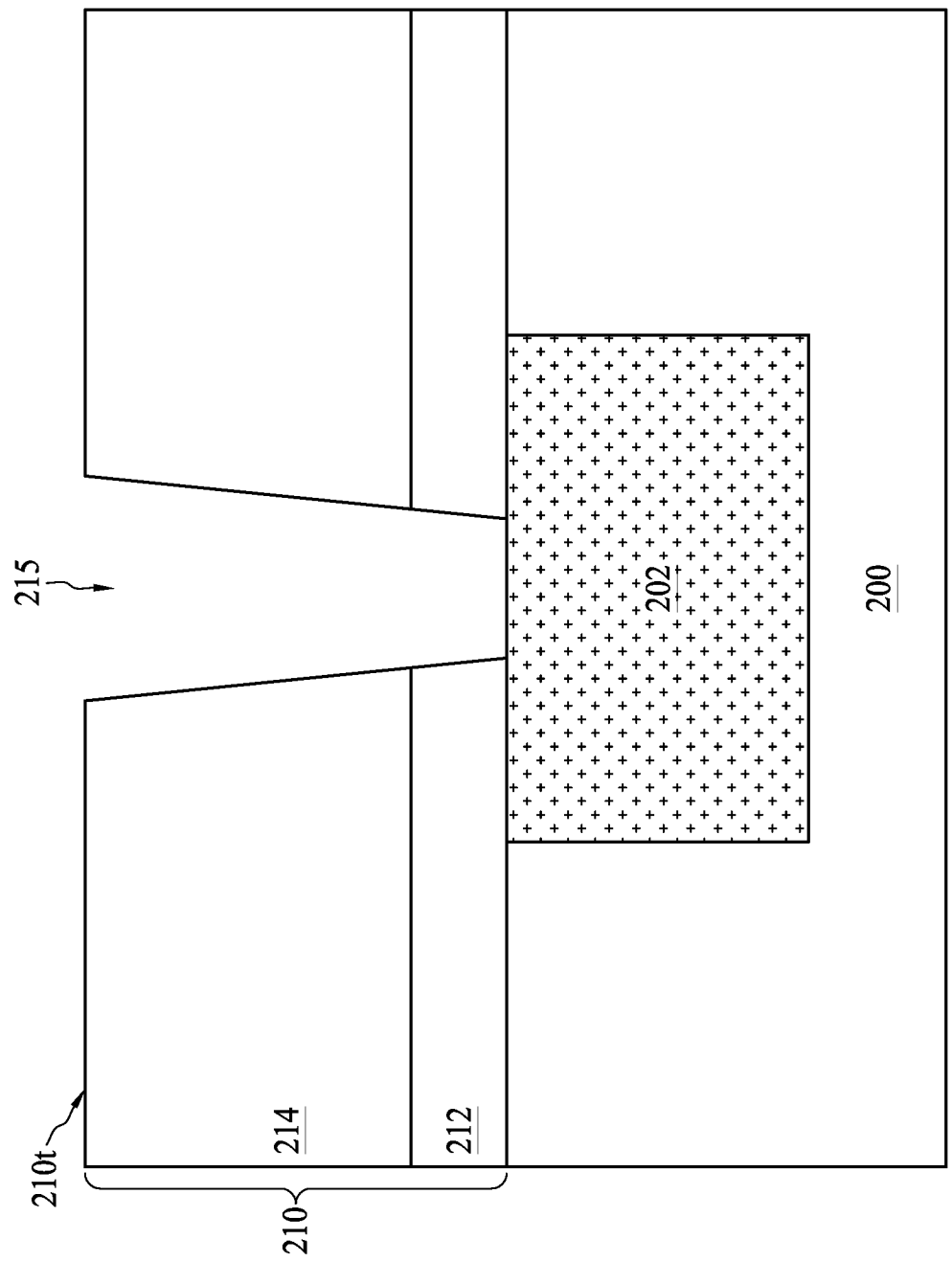
FIGS. 3A to 3F are schematic drawings illustrating various stages in a method for forming a connecting structure according to aspects of one or more embodiments of the present disclosure.

FIGS. 3A to 3F are schematic drawings illustrating various stages in the method for forming the connecting structure 10 according to aspects of one or more embodiments of the present disclosure. In some embodiments, a substrate 200 can be received. The substrate 200 can be the substrate 102 shown in FIG. 1, but the disclosure is not limited thereto. In some embodiments, the substrate 200 can include a semiconductor device, such as the transistor shown in FIG. 1, but the disclosure is not limited thereto. As shown in FIG. 3A, the substrate 200 may include a conductive feature 202 disposed therein. In some embodiments, the conductive feature 202 can be a FEOL feature similar to the metal gate 110 or the source/drain region S/D depicted in FIG. 1. In some embodiments, the conductive feature 202 can be a MEOL feature, such as a cobalt-containing device-level contact similar to the connecting structure 130, 132 depicted in FIG. 1. Additionally, the substrate 200 may include one or more dielectric layers. For example, in some embodiments, the conductive feature 202 can be a BEOL feature, such as a cobalt-containing line of a metal line (M) feature 150 formed in a dielectric layer as depicted in FIG. 1.

In operation 11, a dielectric structure 210 is formed over the substrate 200 and the conductive feature 202. In some embodiments, the dielectric structure 210 can include a single layer. In some embodiments, the dielectric structure 210 can include a multilayered structure. For example, as shown in FIG. 3A, the dielectric structure 210 can include at least a first dielectric layer 212 and a second dielectric layer 214 sequentially stacked over the substrate 200 and the conductive feature 202. The first dielectric layer 212 and the second dielectric layer 214 can include different dielectric materials. For example, the first dielectric layer 212 can be a contact etch-stop layer (CESL), and the second dielectric layer can be an ILD layer or an IMD layer. In some embodiments, the CESL can include silicon nitride, silicon oxynitride, and the like. The ILD layer or the IMD layer can include materials as mentioned above.

Still referring to FIG. 3A, in operation 11, an opening 215 can be formed in the dielectric structure 210. In some embodiments, the opening 215 penetrates the dielectric structure 210 from a top surface 210t to a bottom of the dielectric structure 210. Accordingly, a portion of the conductive feature 202 is exposed through the opening 215. The opening 215 can be formed using a lithographic process with masking technologies and an anisotropic etch operation (e.g., plasma etching or reactive ion etching), but the disclosure is not limited thereto.

Figure 3B:
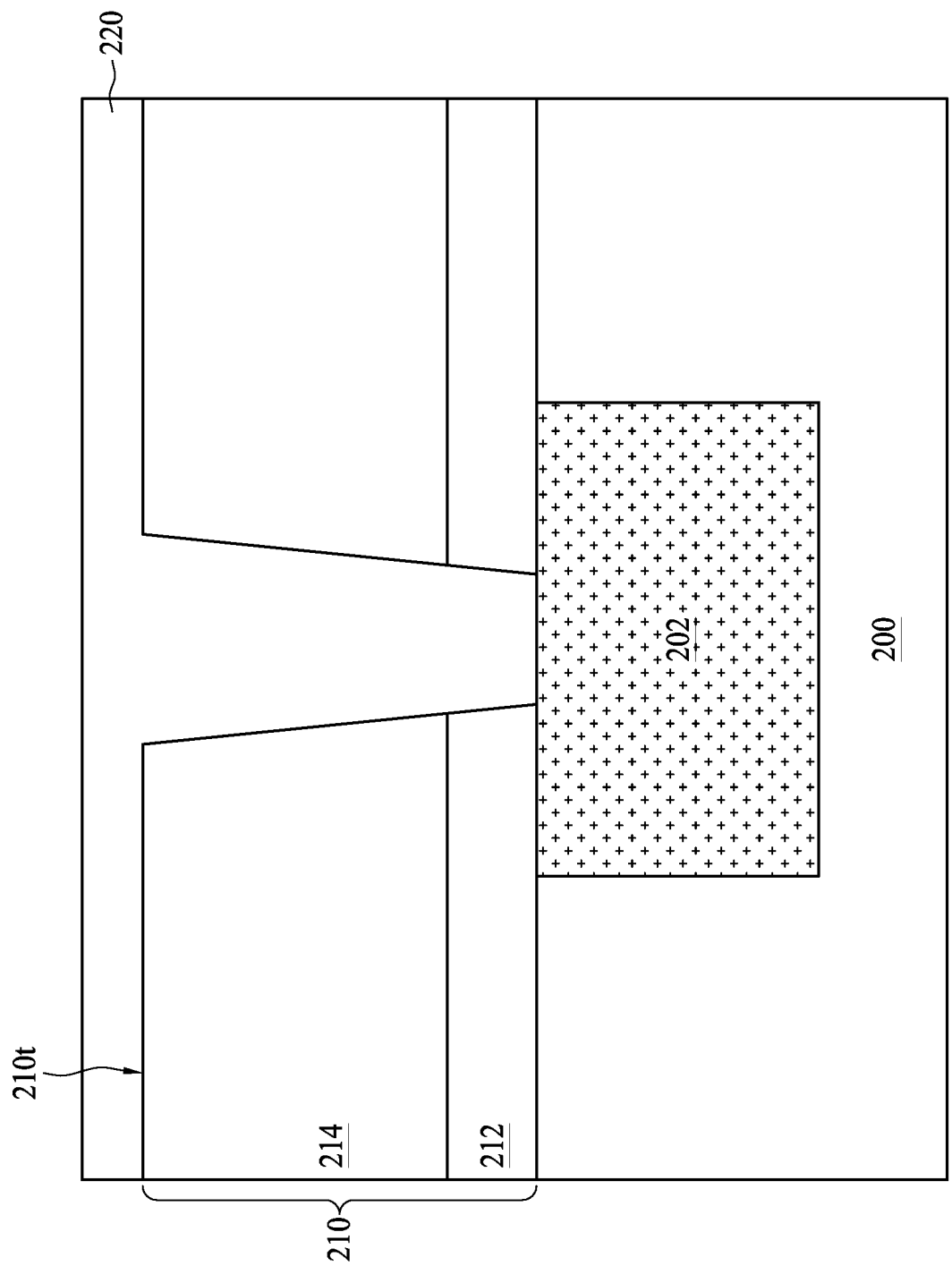

Referring to FIG. 3B, in operation 12, a metal layer 220, such as a noble metal layer, can be formed to fill the opening 215, but the disclosure is not limited thereto. The noble metal layer can include rhenium (Re), rhodium (Rh) and ruthenium (Ru). The metal layer 220 extends from the top surface 210t of the dielectric structure 210 to the bottom of the dielectric structure 210. The metal layer 220 penetrates the second dielectric layer 214 and the first dielectric layer 212 to contact the exposed portion of the conductive feature 202. Further, the metal layer 220 covers the top surface 210t of the dielectric structure 210.

It should be noted that, in some embodiments, the metal layer 220 can be formed in absence of a liner, a barrier, a seed layer or any intervening layer. Therefore, in such embodiments, the metal layer 220 can be in contact with the dielectric structure 210, but the disclosure is not limited thereto.

Figure 3C:
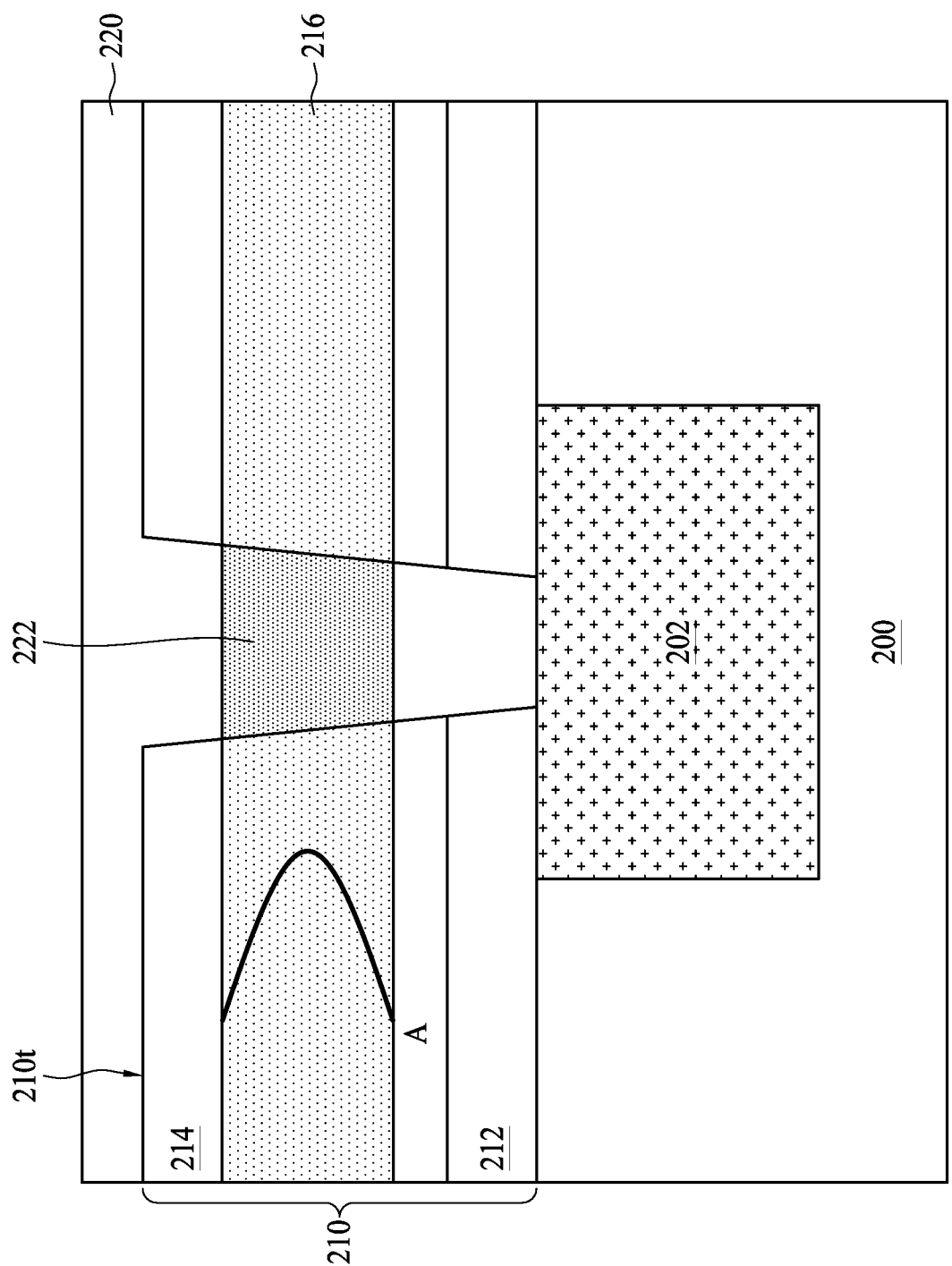

Referring to FIG. 3C, in operation 13, a doped metal portion 222 is formed in the metal layer 220 and a doped dielectric layer 216 is formed in the dielectric structure 210. In some embodiments, the doped metal portion 222 and the doped dielectric layer 216 include same dopants, and the dopants may include germanium (Ge), silicon (Si), argon (Ar), xenon (Xe), or nitrogen (N), but the disclosure is not limited thereto. The forming of the doped metal portion 222 and the doped dielectric layer 216 includes an ion implantation. In some embodiments, a dosage of the ion implantation can be between approximately $1E13$ cm$^{-2}$ and approximately $1E16$ cm$^{-2}$, an angle of the ion implantation can be between approximately 0 degrees and approximately 60 degrees, and a temperature of the ion implantation can be between approximately $-100°$ C. and approximately $500°$ C. In some embodiments, a concentration of the dopants in the doped dielectric layer 216 can be between approximately $1E19$ atom/cm$^3$ and approximately $1E12$ atom/cm$^3$, but the disclosure is not limited thereto. In some embodiments, a concentration of the dopants in the doped metal portion 222 can be between approximately $1E19$ atom/cm$^3$ and approximately $1E12$ atom/cm$^3$, but the disclosure is not limited thereto.

In some embodiments, a top surface of the doped metal portion 222 is separated from a top surface of the metal layer 220, and a top surface of the doped dielectric layer 216 is separated from the top surface of the dielectric structure 210, such as the top surface of the second dielectric layer 214. In some embodiments, by adjusting the implantation energy of the ion implantation, the doped dielectric layer 216 can be formed entirely within the second dielectric layer 214. In some embodiments, a bottom surface of the doped dielectric layer 216 is separated from the substrate 200 by the first dielectric layer 212 and portions of the second dielectric layer 214. Additionally, the bottom surface of the doped dielectric layer 216 is in contact with the second dielectric layer 214. A bottom surface of the doped metal portion 222 is separated from the conductive feature 202 such that a resistance of the conductive feature 202 will not be affected by the dopants. Additionally, the bottom surface of the doped metal portion 222 and the bottom surface of the doped dielectric layer 216 may be aligned with each other, but the disclosure is not limited thereto. A distribution of the dopants in the doped metal portion 222 and in the doped dielectric layer 216 is depicted as the curve A shown in FIG. 3C. In some embodiments, a peak of the distribution curve can be near the middle of the doped metal portion 222 and the middle of the doped dielectric layer 216, but the disclosure is not limited thereto. In some embodiments, a thickness of the doped metal portion 222 is less than a thickness of the metal layer 220, and a thickness of the doped dielectric layer 216 is less than a thickness of the dielectric structure 210. In some embodiments, the thickness of the doped dielectric layer 216 is less than a thickness of the second dielectric layer 214.

Figure 3D:
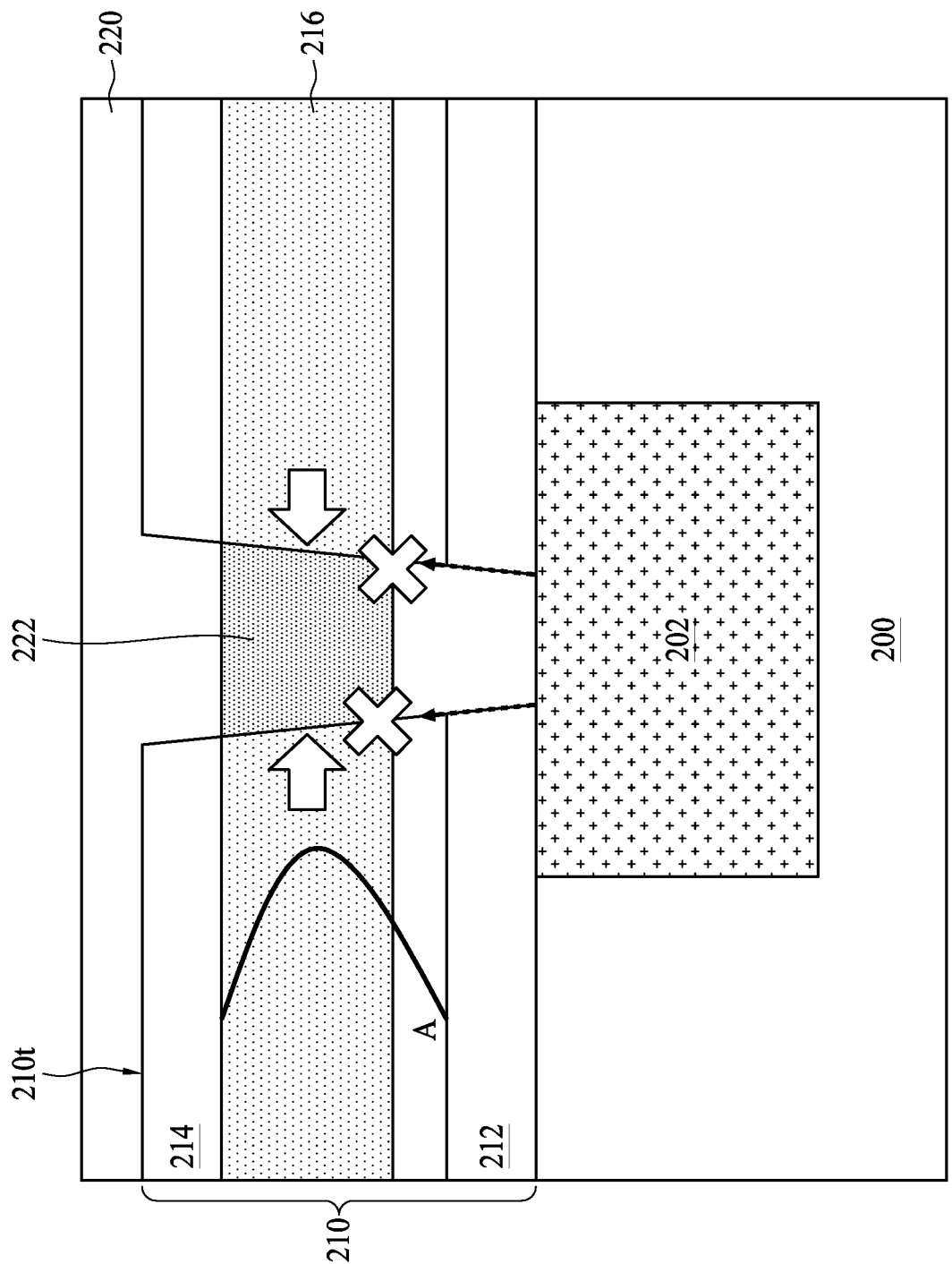

Referring to FIG. 3D, in some embodiments, an anneal ranging from approximately $100°$ C. to approximately $500°$ C. is performed to improve the gap-filling results, reduce plug resistance and improve an interface quality. A pressure for the anneal can range from approximately 100 mTorr to approximately 760 mTorr, but the disclosure is not limited thereto. A process duration for the anneal can range from approximately 10 minutes to a approximately 120 minutes, but the disclosure is not limited thereto. Further, gas such as nitrogen ($N_2$), hydrogen ($H_2$) helium (He) and/or argon (Ar) can be used in the anneal. During the anneal, metal diffusion may occur, and metal ions may move from the conductive feature 202 to an upper portion of the metal layer 220 along the interface between the dielectric structure 210 and the metal layer 220. It should be noted that because the dopants, for example Ge, have a volume greater than that of the dielectric material of the doped dielectric layer 216, a compressive stress is generated from the doped dielectric layer 216 due to the existence of the greater volume of dopants as indicated by the arrows along opposing sidewalls of the doped metal portions 222. In some embodiments, the doped dielectric layer 216 may be referred to as a compressive stress layer. Further, the compressive stress helps to obstruct or reduce the metal diffusion along the interface between the dielectric structure 210 and the metal layer 220, as shown by the "X" and upward arrows in FIG. 3D. Therefore, the metal-loss issue can be mitigated or reduced.

Figure 3E:
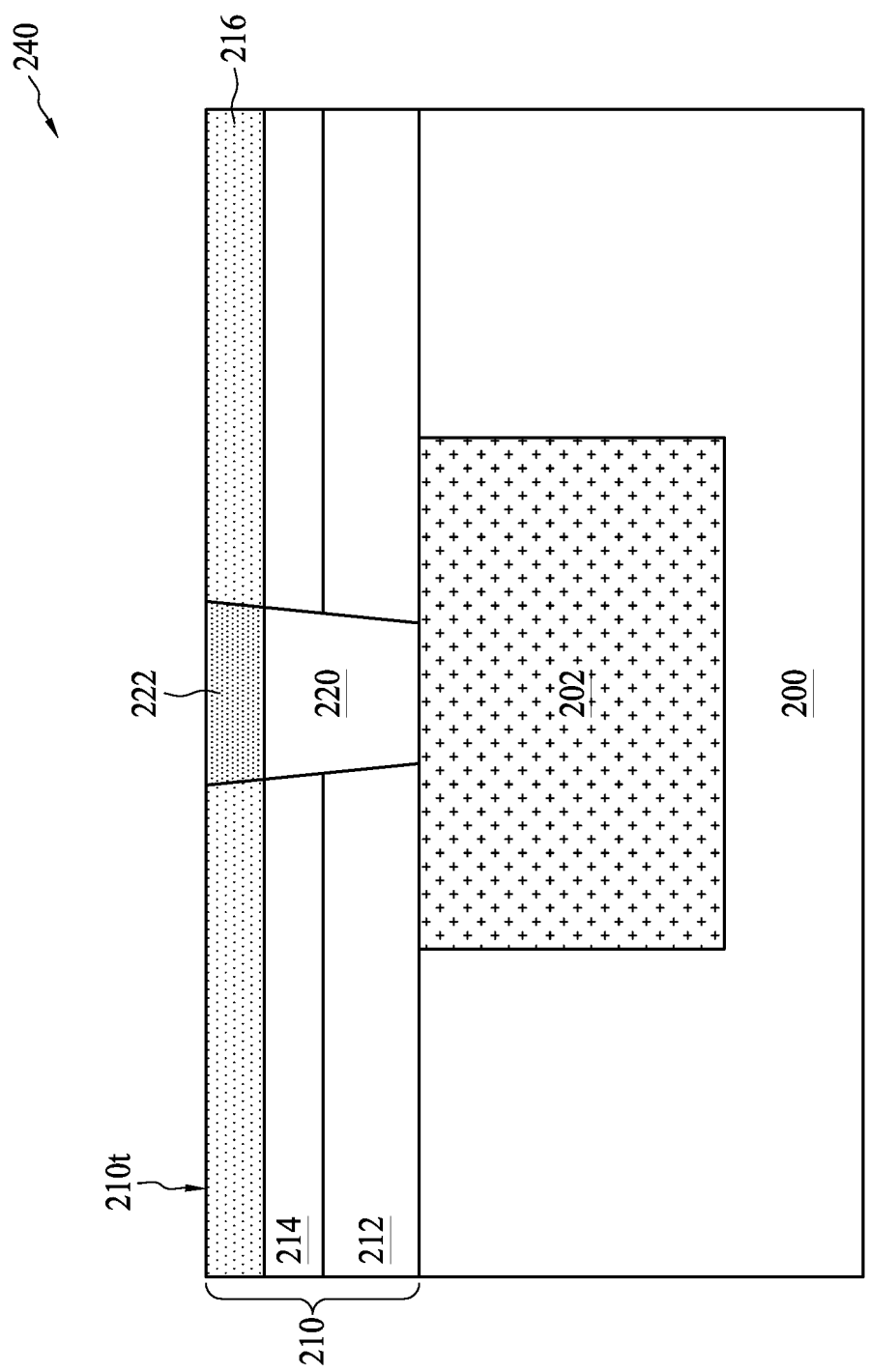

Referring to FIG. 3E, in operation 14, a portion of the metal layer 220 is removed to expose and/or recess the top surface 210t of the dielectric structure 210 and form a connecting structure 240. In some embodiments, in operation 14, a portion of the doped metal portion 222 and a portion of the doped dielectric layer 216 can be removed. In some embodiments, the removal of the portion of the metal layer 220, the portion of the doped metal portion 222 and the portion of the doped dielectric layer 216 can be performed using a chemical-mechanical polishing (CMP) operation.

Figure 3F:
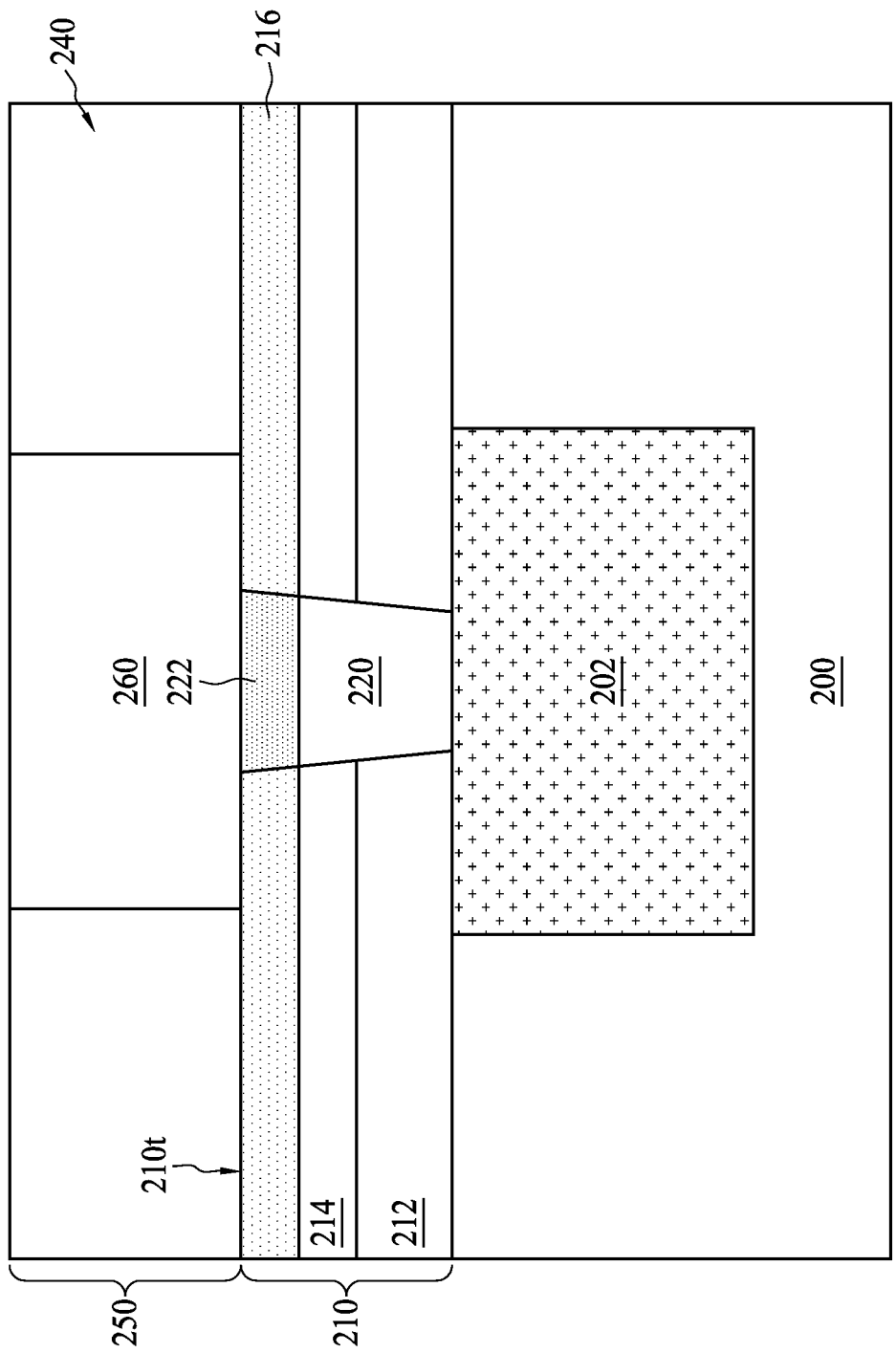

Referring to FIG. 3F, in some embodiments, another dielectric structure 250 can be formed over the dielectric structure 210 and the connecting structure 240. Another conductive feature 260 can be formed in the dielectric structure 250. The conductive feature 260 can be coupled to the connecting structure 240. In some embodiments, the conductive feature 260 can be referred to as the connecting structures 140, 142 in FIG. 1. In some embodiments, the conductive feature 260 can be referred to as the metal line 150 in FIG. 1.

Accordingly, a connecting structure 240 is obtained. The connecting structure 240 includes the first dielectric layer 212 disposed over the conductive feature 202, the second dielectric layer 214 disposed over the first dielectric layer 212, the doped dielectric layer 216 disposed over the first dielectric layer 212 and the second dielectric layer 214, the metal layer 220 serving as a metal portion disposed in the first dielectric layer 212 and the second dielectric layer 214, and the doped metal portion 222 over the metal portion 220. The second dielectric layer 214 is between the doped dielectric layer 216 and the first dielectric layer 212. As shown in FIG. 3E, the metal portion 220 is in contact with the conductive feature 202, the first dielectric layer 212 and the second dielectric layer 214, while the doped metal portion 222 is in contact with the doped dielectric layer 216. A top surface of the doped metal portion 222 is aligned with a top surface of the doped dielectric layer 216.

Additionally, in some embodiments, the peak of the distribution curve of the dopants in the doped metal portion 222 may be observed below the top surface of the doped metal portion 222, but the disclosure is not limited thereto. For example, in some embodiments, the peak of the distribution curve of the dopants in the doped metal portion 222 may be observed at the top surface of the doped metal portion 222. In some embodiments, the peak of the distribution curve of the dopants in the doped dielectric layer 216 may be observed below the top surface of the doped dielectric layer 216, but the disclosure is not limited thereto. For example, in some embodiments, the peak of the distribution curve of the dopants in the doped dielectric layer 216 may be observed at the top surface of the doped dielectric layer 216.

In such embodiments, the metal portion 220 and the doped metal portion 222 include a same metal material, and the doped dielectric layer 216 and the second dielectric layer 214 include a same dielectric material. Further, the doped metal portion 222 and the doped dielectric layer 216 include the same dopants.

Figure 4:
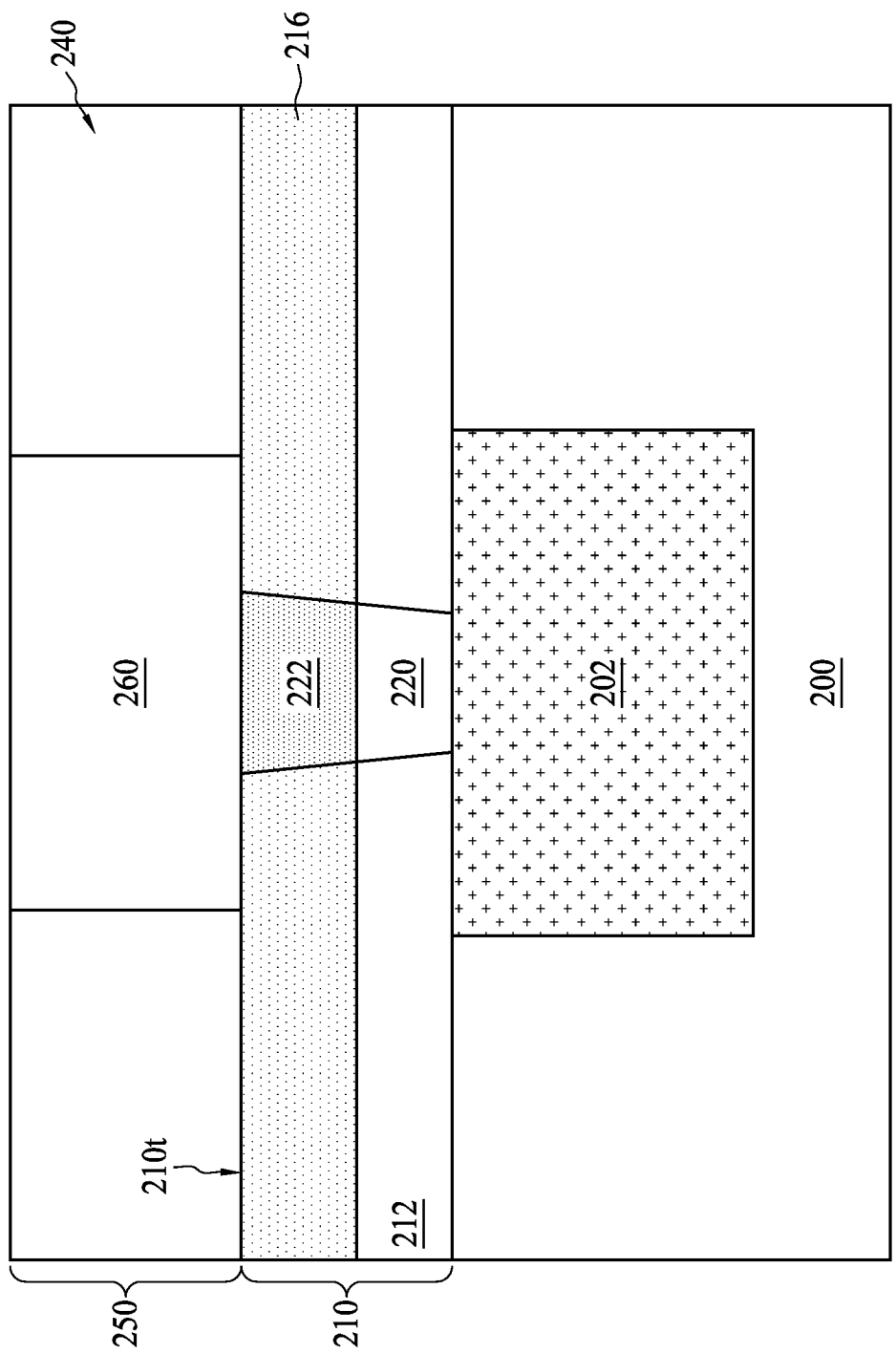
FIG. 4 is a schematic drawing illustrating a connecting structure according to aspects of one or more embodiments of the present disclosure.

FIG. 4 is a schematic drawing illustrating a connecting structure according to aspects of different embodiments of the present disclosure. It should be understood that same elements in FIG. 4 and FIG. 3F are depicted by same numerals, and repetitive details may be omitted in the interest of brevity.

It should be noted that depths or locations where the doped metal portion 222 and the doped dielectric layer 216 are formed can be determined by an implantation energy of the ion implantation. In some embodiments, by adjusting the implantation energy, the bottom surface of the doped dielectric layer 216 can be formed to contact the first dielectric layer 212, as shown in FIG. 4. Additionally, the bottom surface of the doped dielectric layer 216 and a bottom surface of the doped metal portion 222 may be aligned, but the disclosure is not limited thereto.

Additionally, in some embodiments, the peak of the distribution curve of the dopants in the doped metal portion 222 may be observed below the top surface of the doped metal portion 222, but the disclosure is not limited thereto. For example, in some embodiments, the peak of the distribution curve of the dopants in the doped metal portion 222 may be observed at the top surface of the doped metal portion 222. In some embodiments, the peak of the distribution curve of the dopants in the doped dielectric layer 216 may be observed below the top surface of the doped dielectric layer 216, but the disclosure is not limited thereto. For example, in some embodiments, the peak of the distribution curve of the dopants in the doped dielectric layer 216 may be observed at the top surface of the doped dielectric layer 216.

Figure 5:
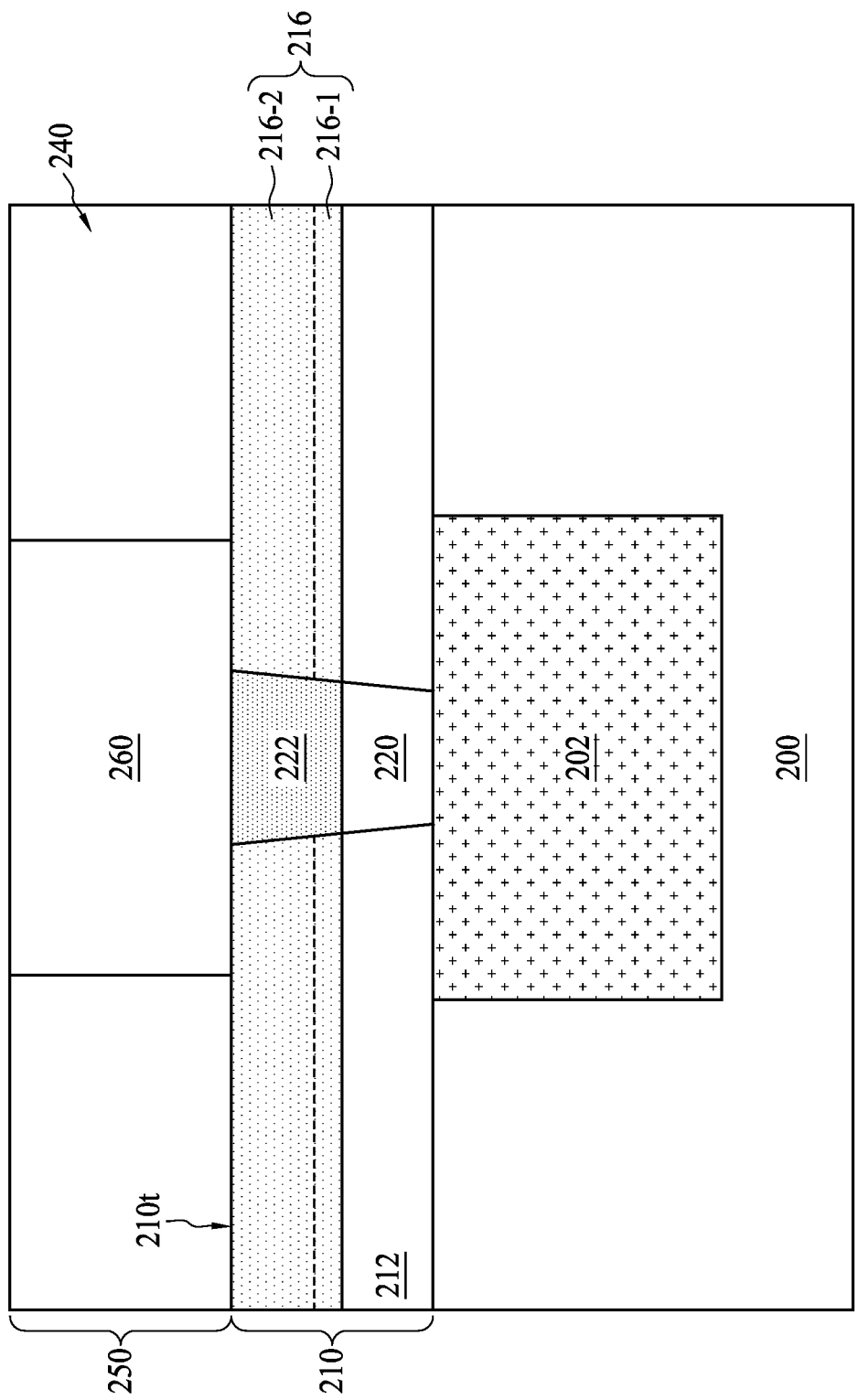
FIG. 5 is a schematic drawing illustrating a connecting structure according to aspects of one or more embodiments of the present disclosure.

Referring to FIG. 5, in some embodiments, by adjusting the implantation energy, the doped dielectric layer 216 and the doped metal portion 222 can be formed deeper than those shown in FIGS. 3F and 4. For example, the doped dielectric layer 216 can be formed by implanting the dopants into the first dielectric layer 212 and the second dielectric layer 214. Accordingly, the doped dielectric layer 216 may include two portions. As shown in FIG. 5, the doped dielectric layer 216 can include a first portion 216-1 including a first dielectric material the same as that of the first dielectric layer 212, and a second portion 216-2 including a second dielectric material the same as that of the second dielectric layer 214.

Additionally, in some embodiments, the peak of the distribution curve of the dopants in the doped metal portion 222 may be observed below the top surface of the doped metal portion 222, but the disclosure is not limited thereto. For example, in some embodiments, the peak of the distribution curve of the dopants in the doped metal portion 222 may be observed at the top surface of the doped metal portion 222. In some embodiments, the peak of the distribution curve of the dopants in the doped dielectric layer 216 may be observed below the top surface of the second portion 216-2 of doped dielectric layer 216, but the disclosure is not limited thereto. For example, in some embodiments, the peak of the distribution curve of the dopants in the doped dielectric layer 216 may be observed at the top surface of the second portion 216-2 of the doped dielectric layer 216.

FIGS. 6A to 11 are schematic drawings illustrating various stages in the method for forming the connecting structure 10 according to aspects of different embodiments of the present disclosure. It should be understood that same elements in FIGS. 6A to 11, and FIGS. 3A to 3F are depicted by same numerals, and repetitive details may be omitted in the interest of brevity.

Figure 6A:
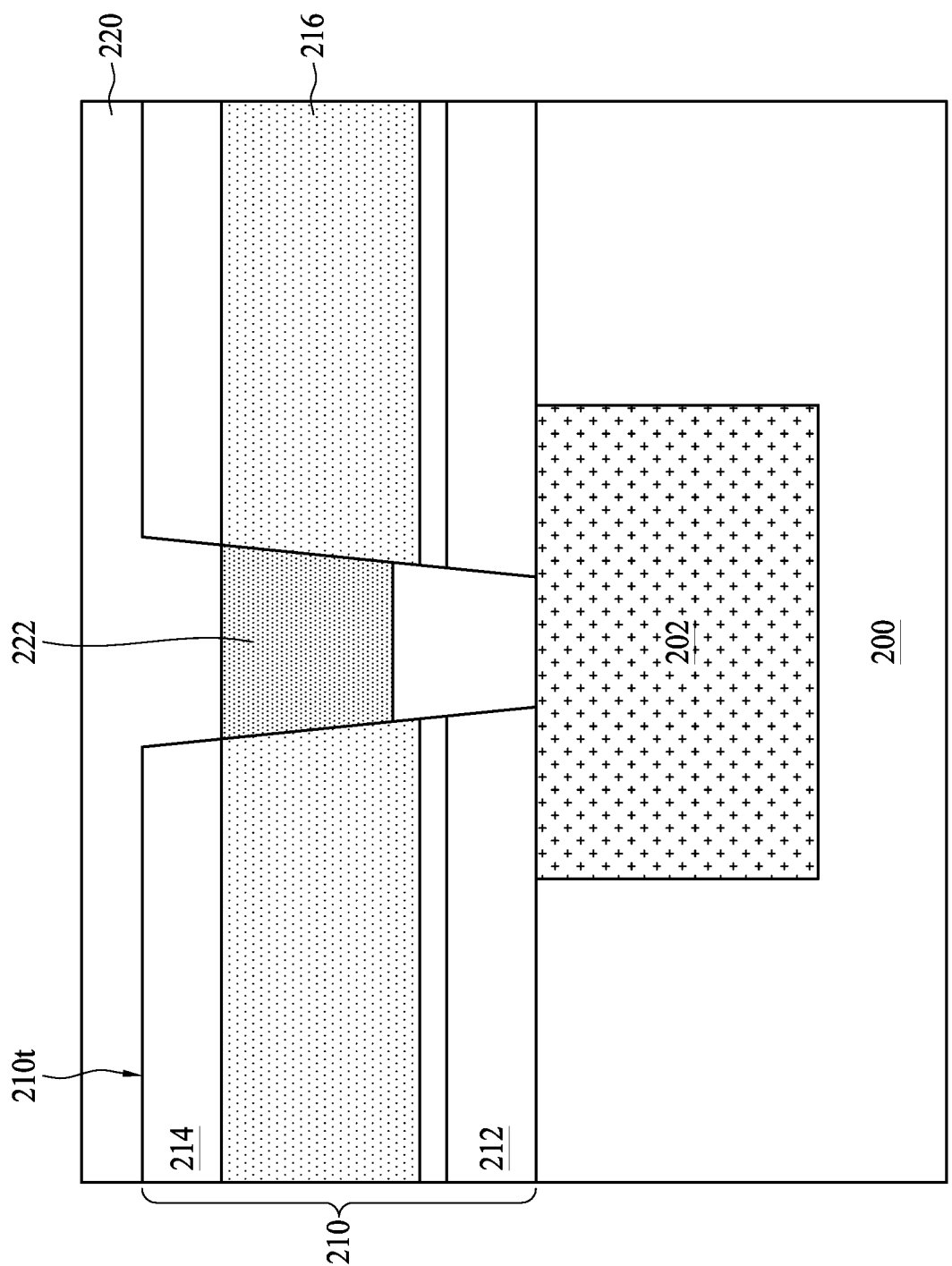
FIGS. 6A to 6D are schematic drawings illustrating various stages in a method for forming a connecting structure according to aspects of one or more embodiments of the present disclosure.

In some embodiments, a substrate 200 can be received. As shown in FIG. 6A, the substrate 200 may include a conductive feature 202 disposed therein. In operation 11, a dielectric structure 210 is formed over the substrate 200 and the conductive feature 202, and an opening can be formed in the dielectric structure 210. In operation 12, a metal layer 220, such as a noble metal layer, can be formed to fill the opening. As shown in FIG. 6A, the metal layer 220 extends from the top surface 210t of the dielectric structure 210 to the bottom of the dielectric structure 210. The metal layer 220 penetrates the second dielectric layer 214 and the first dielectric layer 212 to contact the exposed portion of the conductive feature 202. Further, the metal layer 220 covers the top surface 210t of the dielectric structure 210. As mentioned above, in some embodiments, the metal layer 220 can be formed in the absence of a liner, a barrier, a seed layer or any intervening layer. Therefore, in such embodiments, the metal layer 220 can be in contact with the dielectric structure 210, but the disclosure is not limited thereto.

Figure 8:
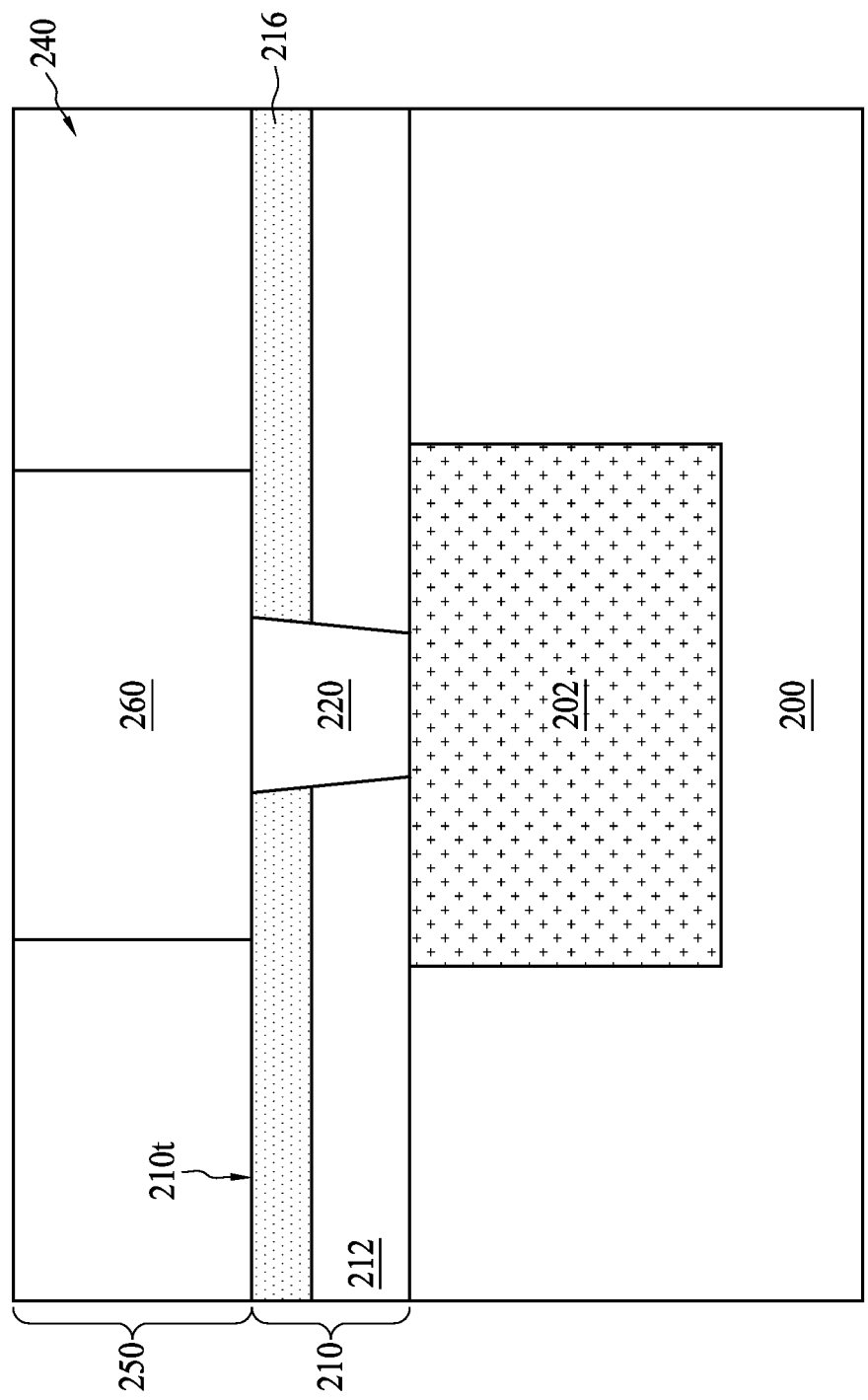
FIG. 8 is a schematic drawing illustrating a connecting structure according to aspects of one or more embodiments of the present disclosure.
Figure 9:
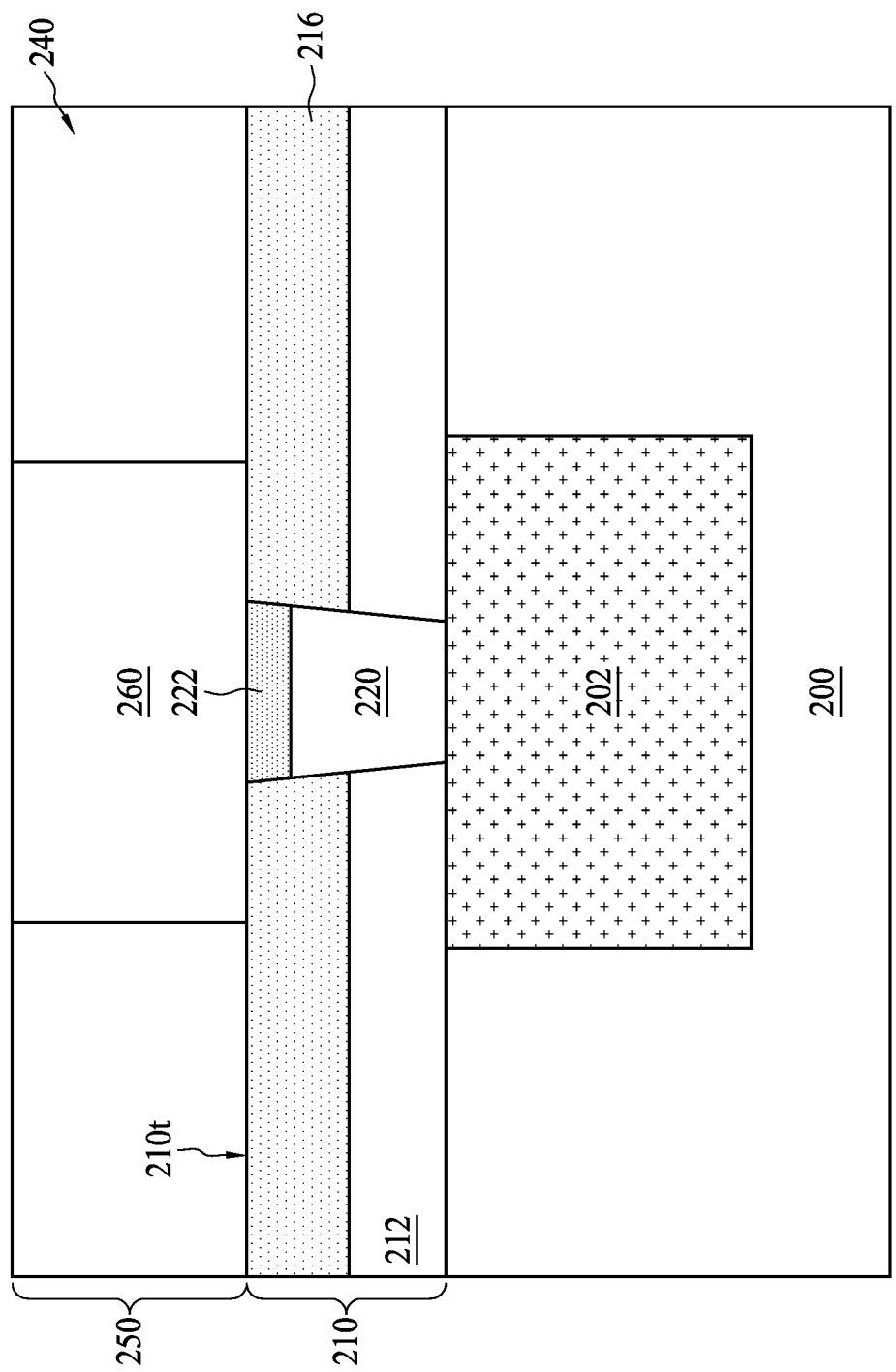
FIG. 9 is a schematic drawing illustrating a connecting structure according to aspects of one or more embodiments of the present disclosure.
Figure 10:
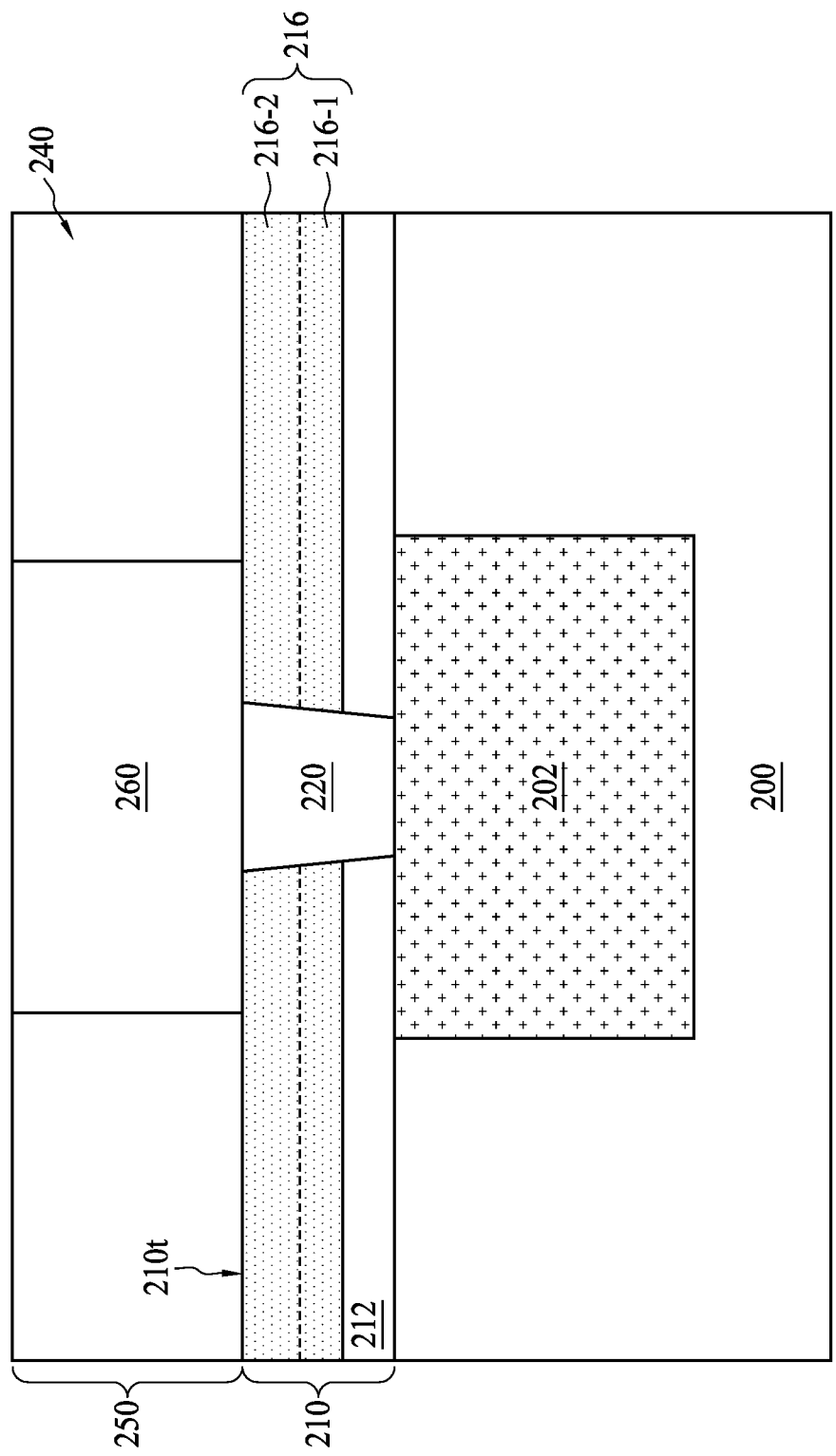
FIG. 10 is a schematic drawing illustrating a connecting structure according to aspects of one or more embodiments of the present disclosure.
Figure 11:
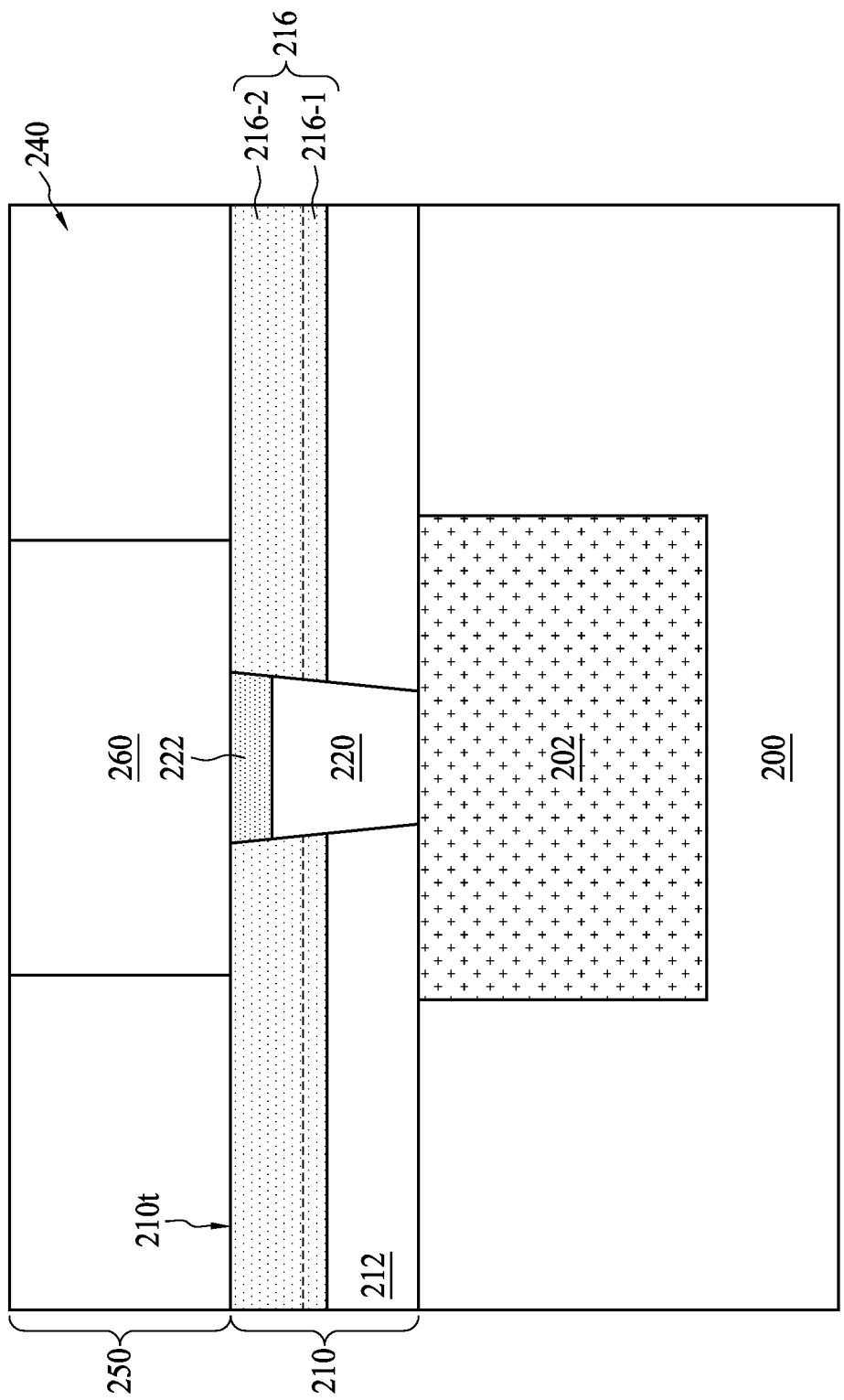
FIG. 11 is a schematic drawing illustrating a connecting structure according to aspects of one or more embodiments of the present disclosure.

Still referring to FIG. 6A, in operation 13, a doped metal portion 222 is formed in the metal layer 220 and a doped dielectric layer 216 is formed in the dielectric structure 210. In some embodiments, the forming of the doped metal portion 222 and the doped dielectric layer 216 includes an ion implantation. Dopants, dosage, angle and temperature used in the ion implantation can be similar to those described above; therefore, details are omitted for brevity. It should be noted that depths of locations where the doped metal portion 222 and the doped dielectric layer 216 are formed can be determined by an implantation energy of the ion implantation. For example, by adjusting the implantation energy, a bottom surface of the doped dielectric layer 216 can be formed to contact the second dielectric layer 214 as shown in FIGS. 6A to 6D and 7, to contact a top surface of the first dielectric layer 212 as shown in FIGS. 8 and 9, or to be lower than the top surface of the first dielectric layer 212 as shown in FIGS. 10 and 11.

In some embodiments, the dopants in the dielectric structure 214 may penetrate deeper than the dopants in the metal layer 220 because the dielectric materials are less dense than the metal material. Therefore, a bottom surface of the doped dielectric layer 216 may be lower than a bottom surface of the doped metal portion 222, as shown in FIGS. 6A, 7, 9 and 11. For example, in some embodiments, a depth of the bottom surface of the doped dielectric layer 216 can be lower than approximately 40 nanometers from the top surface of the doped dielectric layer 216. In some embodiments, the depth of the bottom surface of the doped dielectric layer 216 can be lower than approximately 40 nanometers to approximately 90 nanometers from the top surface of the doped dielectric layer 216. In some embodiments, a depth of the bottom surface of the doped metal portion 222 can be lower than approximately 0 nanometer to approximately 40 nanometers from the top surface of the doped metal portion 222.

Figure 6B:
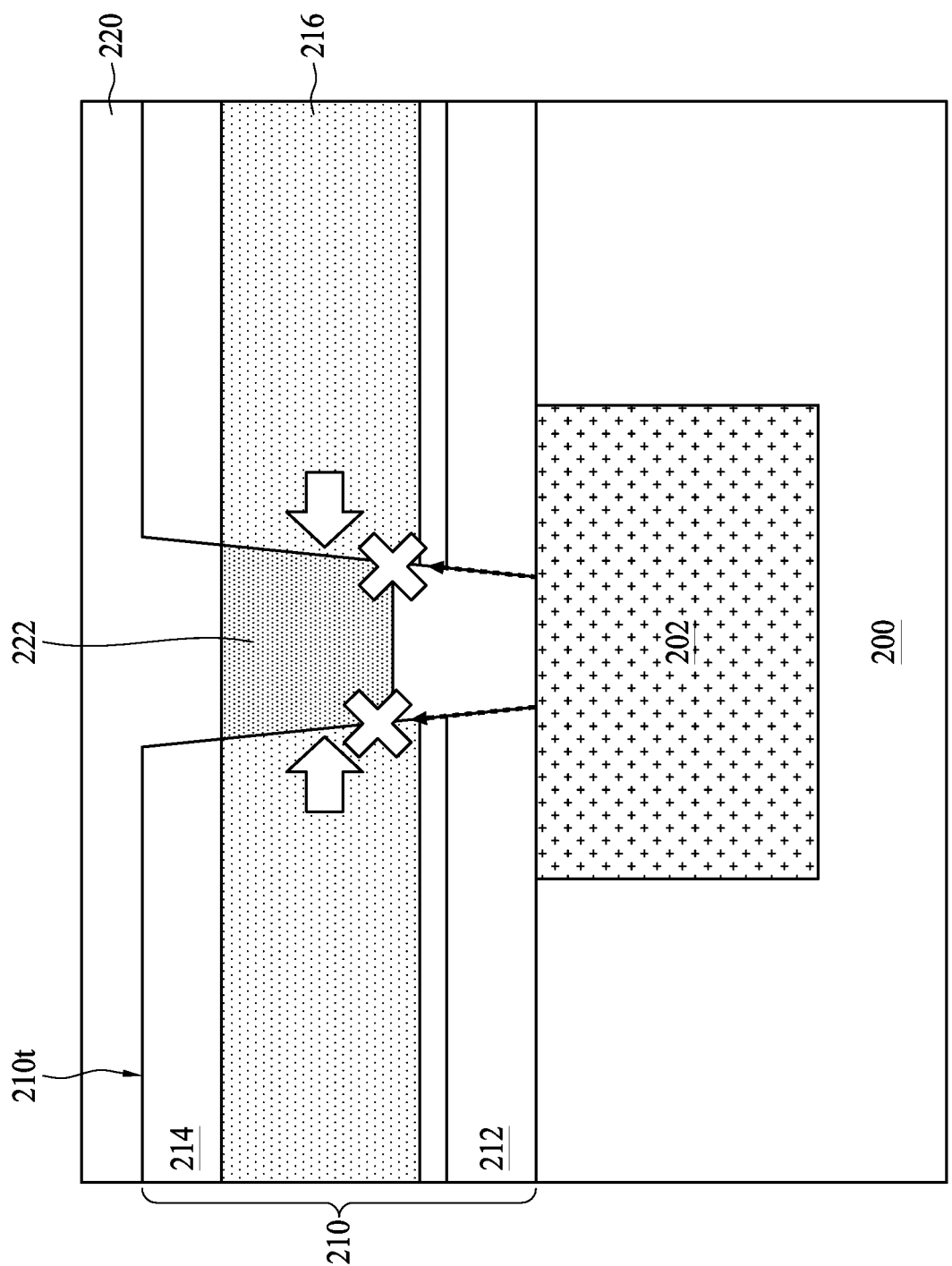

Referring to FIG. 6B, in some embodiments, an anneal is performed to improve the gap-filling results, reduce plug resistance and improve an interface quality. During the anneal, metal diffusion may occur, and metal ions may move from the conductive feature 202 to an upper portion of the metal layer 220 along the interface between the dielectric structure 210 and the metal layer 220. As mentioned above, the dopants in the doped dielectric layer 216 makes the doped dielectric layer 216 serve as a compressive stress layer. The compressive stress from the doped dielectric layer 216 helps to obstruct the metal diffusion, as shown in FIG. 6B. Therefore, the metal-loss issue can be mitigated or reduced.

Figure 6C:
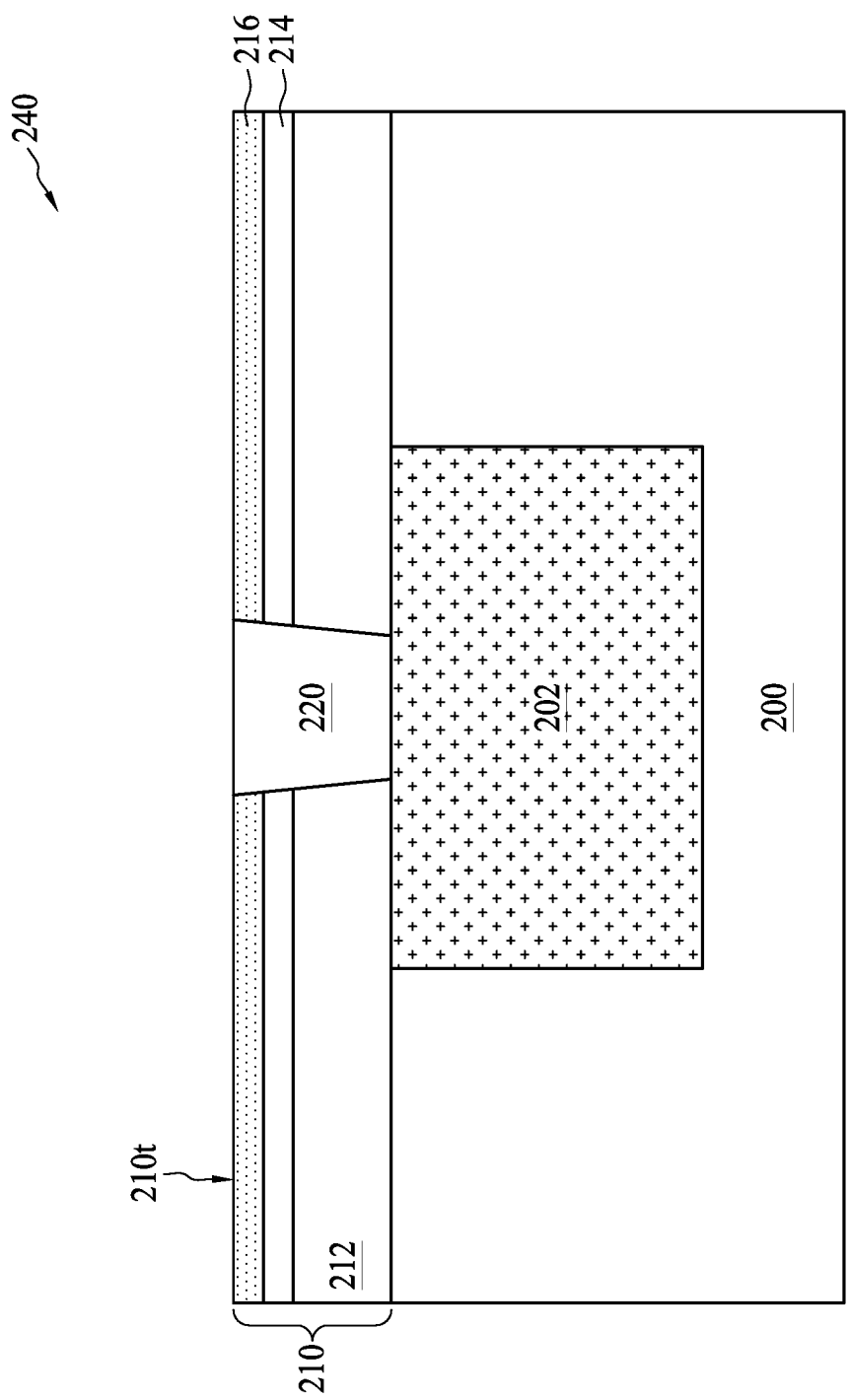

Referring to FIG. 6C, in operation 14, a portion of the metal layer 220 is removed to expose or recess the top surface 210t of the dielectric structure 210 and form a connecting structure 240. In some embodiments, the doped metal portion 222 may be entirely removed, but the disclosure is not limited thereto. In some embodiments, a portion of the dielectric structure 210, such as a portion of the doped dielectric layer 216, can be removed in operation 14. In some embodiments, the removal of the portion of the metal layer 220, the doped metal portion 222 and the portion of the dielectric structure 210 can be performed using a CMP operation.

Figure 6D:
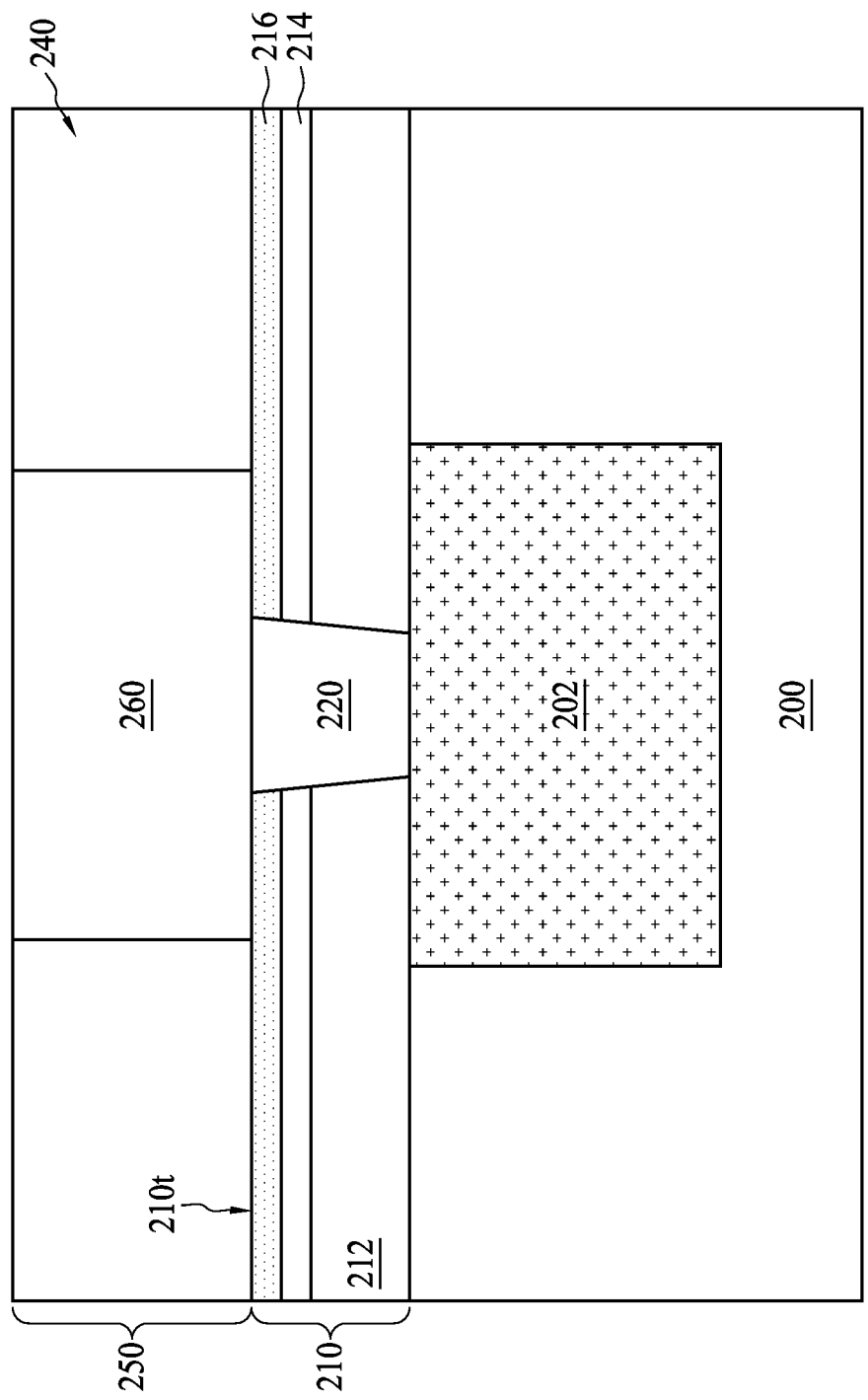

Referring to FIG. 6D, in some embodiments, another dielectric structure 250 can be formed over the dielectric structure 210 and the connecting structure 240. Another conductive feature 260 can be formed in the dielectric structure 250. The conductive feature 260 can be coupled to the connecting structure 240. In some embodiments, the conductive feature 260 can be referred to as the connecting structures 140, 142 in FIG. 1. In some embodiments, the conductive feature 260 can be referred to as the metal line 150 in FIG. 1.

Additionally, in some embodiments, the peak of the distribution curve of the dopants in the doped metal portion 222 may be observed below the top surface of the doped metal portion 222, but the disclosure is not limited thereto. For example, in some embodiments, the peak of the distribution curve of the dopants in the doped metal portion 222 may be observed at the top surface of the doped metal portion 222. In some embodiments, the peak of the distribution curve of the dopants in the doped dielectric layer 216 may be observed below the top surface of the doped dielectric layer 216, but the disclosure is not limited thereto. For example, in some embodiments, the peak of the distribution curve of the dopants in the doped dielectric layer 216 may be observed at the top surface of the doped dielectric layer 216.

Accordingly, a connecting structure 240 is obtained. As shown in FIG. 6C, the connecting structure 240 includes the dielectric structure 210 including the first dielectric layer 212 over the substrate 200 and the conductive feature 202, the second dielectric layer 214 over the first dielectric layer 212, the doped dielectric layer 216 over the second dielectric layer 214, and the metal layer 220 disposed over the conductive feature 202 and referred to as a metal portion. As shown in FIG. 6C, the metal portion 220 is in contact with the conductive feature 202, the first dielectric layer 212, the second dielectric layer 214 and the doped dielectric layer 216. A top surface of the metal portion 220 is aligned with a top surface of the doped dielectric layer 216. Further, the metal portion 220 may be free of the dopants. In such embodiments, a bottom surface of the doped dielectric layer 216 is in contact with the second dielectric layer 214. In such embodiments, the doped dielectric layer 216 and the second dielectric layer 214 include the same dielectric materials.

Figure 7:
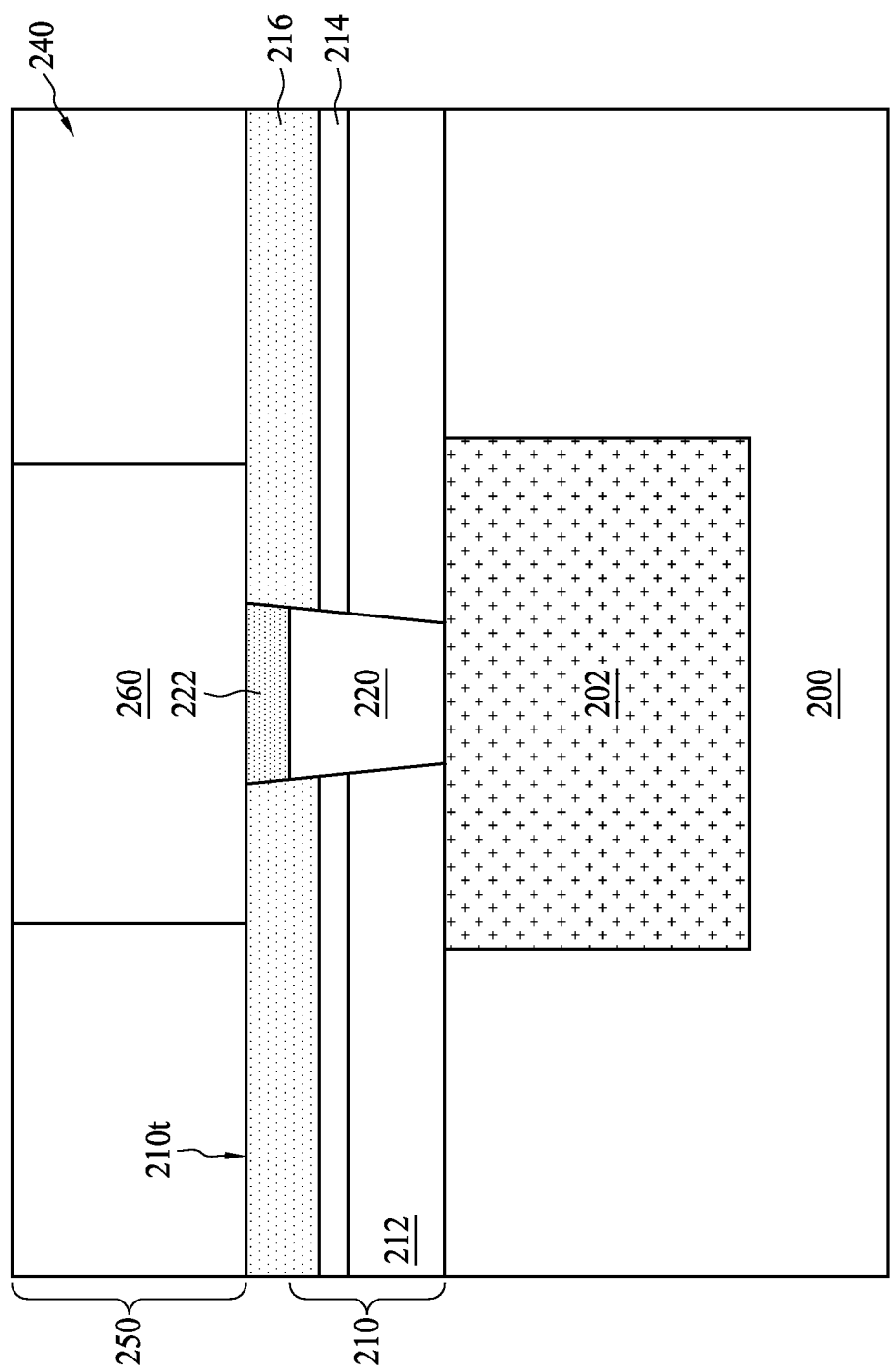
FIG. 7 is a schematic drawing illustrating a connecting structure according to aspects of one or more embodiments of the present disclosure.

Referring to FIG. 7, in operation 14, in some embodiments, a portion of the metal layer 220 and a portion of the doped metal portion 222 are removed to expose the top surface 210t of the dielectric structure 210 and form a connecting structure 240. In such embodiments, a top surface of the doped metal portion 222 is aligned with a top surface of the doped dielectric layer 216, but a bottom surface of the doped metal portion 222 is higher than a bottom surface of the doped dielectric layer 216.

Referring to FIGS. 8 and 9, as mentioned above, by adjusting the implantation energy of the ion implantation, the doped dielectric layer 216 can be formed to contact the first dielectric layer 212. In such embodiments, a bottom surface of the doped dielectric layer 216 is in contact with the first dielectric layer 212. Further, the doped dielectric layer 216 and the first dielectric layer 212 include different dielectric materials. By adjusting the planarization operation, the doped metal portion 222 can be entirely removed. Thus, the metal portion 220 may be free of the dopants, as shown in FIG. 8. In other embodiments, the doped metal portion 222 can be partially removed, as shown in FIG. 9.

As mentioned above, by entirely or partially removing the doped metal portion 222, a top surface of the doped dielectric layer 216 may be aligned with a top surface of the metal portion 220 as shown in FIG. 8, or the top surface of the doped dielectric layer 216 may be aligned with a top surface of the doped metal portion 222 as shown in FIG. 9.

Additionally, in some embodiments, the peak of the distribution curve of the dopants in the doped metal portion 222 may be observed below the top surface of the doped metal portion 222, but the disclosure is not limited thereto. For example, in some embodiments, the peak of the distribution curve of the dopants in the doped metal portion 222 may be observed at the top surface of the doped metal portion 222. In some embodiments, the peak of the distribution curve of the dopants in the doped dielectric layer 216 may be observed below the top surface of the doped dielectric layer 216, but the disclosure is not limited thereto. For example, in some embodiments, the peak of the distribution curve of the dopants in the doped dielectric layer 216 may be observed at the top surface of the doped dielectric layer 216.

Referring to FIGS. 10 and 11, as mentioned above, by adjusting the implantation energy of the ion implantation, the doped dielectric layer 216 can be formed even deeper, such that the doped dielectric layer 216 may include two portions. As shown in FIGS. 10 and 11, the doped dielectric layer 216 can include a first portion 216-1 having a dielectric material the same as that of the first dielectric layer 212, and a second portion 216-2 having a dielectric material the same as that of the second dielectric layer 214. In such embodiments, a bottom surface of the doped dielectric layer 216 is in contact with the first dielectric layer 212. As mentioned above, by adjusting the planarization operation, the doped metal portion 222 can be entirely removed. Thus, the metal portion 220 may be free of the dopants, as shown in FIG. 10. In other embodiments, the doped metal portion 222 can be partially removed, as shown in FIG. 11.

As mentioned above, by entirely or partially removing the doped metal portion 222, a top surface of the doped dielectric layer 216 may be aligned with a top surface of the metal portion 220 as shown in FIG. 10, or may be aligned with the top surface of the doped metal portion 222 as shown in FIG. 11.

Additionally, in some embodiments, the peak of the distribution curve of the dopants in the doped metal portion 222 may be observed below the top surface of the doped metal portion 222, but the disclosure is not limited thereto. For example, in some embodiments, the peak of the distribution curve of the dopants in the doped metal portion 222 may be observed at the top surface of the doped metal portion 222. In some embodiments, the peak of the distribution curve of the dopants in the doped dielectric layer 216 may be observed below the top surface of the second portion 216-2 of doped dielectric layer 216, but the disclosure is not limited thereto. For example, in some embodiments, the peak of the distribution curve of the dopants in the doped dielectric layer 216 may be observed at the top surface of the second portion 216-2 of the doped dielectric layer 216.

Referring to FIGS. 7 to 11, in some embodiments, another dielectric structure 250 can be formed over the dielectric structure 210 and the connecting structure 240. Another conductive feature 260 can be formed in the dielectric structure 250. The conductive feature 260 can be coupled to the connecting structure 240. In some embodiments, the conductive feature 260 can be referred to as the connecting structures 140, 142 in FIG. 1. In some embodiments, the conductive feature 260 can be referred to as the metal line 150 in FIG. 1.

According to the method for forming the connecting structure 10, the doped metal portion 222 and the doped dielectric layer 216 can be formed prior to the removal of the portion of the metal layer 220 and the portion of the dielectric structure 210. The doped dielectric layer 216 provides a compressive stress, such that the metal diffusion along the interface between the metal layer 220 and the dielectric structure 210 can be obstructed or reduced, and the metal-loss issue can be mitigated or reduced.

Figure 12:
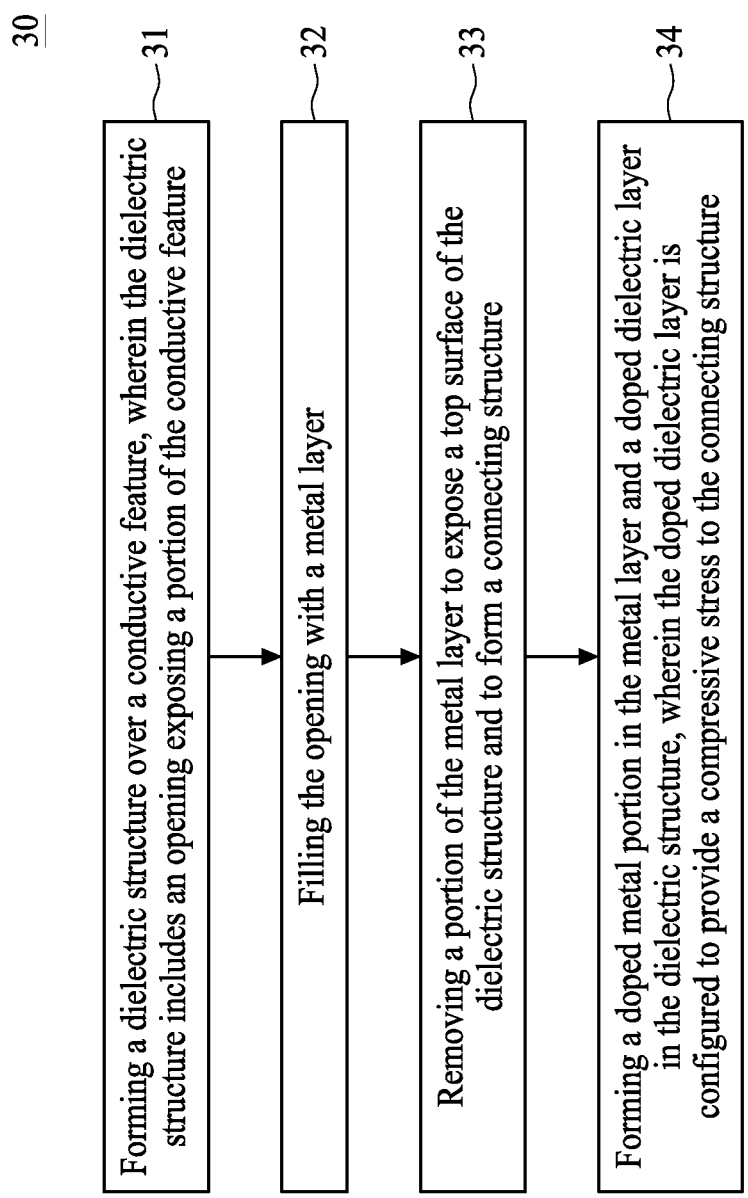
FIG. 12 is a flowchart of a method for forming a connecting structure according to various aspects of the present disclosure.

FIG. 12 is a flowchart representing a method for forming a connecting structure 30 according to aspects of the present disclosure. In some embodiments, the method for forming the connecting structure 30 includes a number of operations (31, 32, 33 and 34). The method for forming the connecting structure 30 will be further described according to one or more embodiments. It should be noted that the operations of the method for forming the connecting structure 30 may be rearranged or otherwise modified within the scope of the various aspects. It should further be noted that additional processes may be provided before, during, and after the method 30, and that some other processes may be only briefly described herein.

Figure 13A:
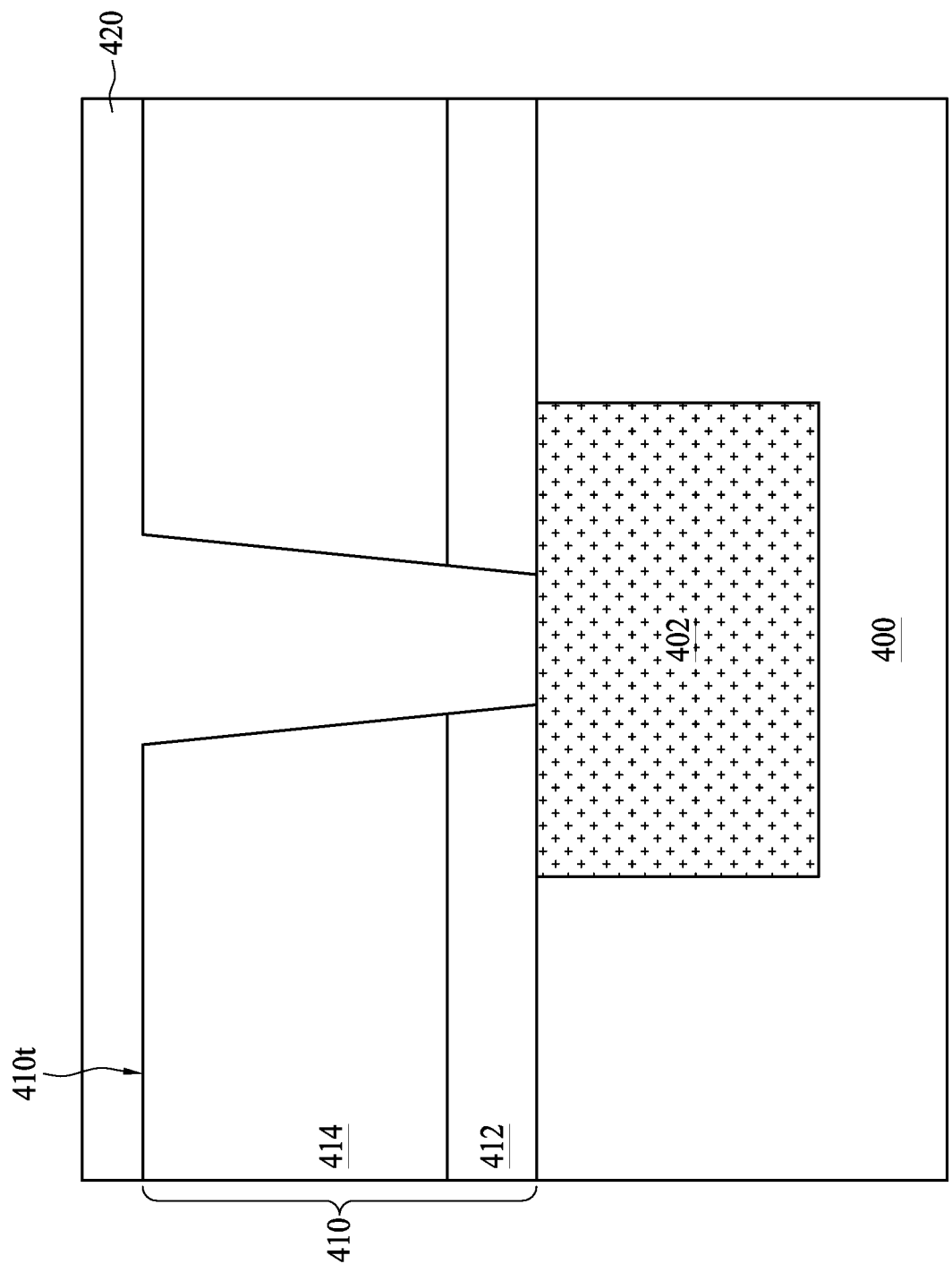
FIGS. 13A to 13E are schematic drawings illustrating various stages in a method for forming a connecting structure according to aspects of one or more embodiments of the present disclosure.

FIGS. 13A to 18 are schematic drawings illustrating various stages in the method for forming the connecting structure 30 according to aspects of one or more embodiments of the present disclosure. It should be noted that same elements in FIGS. 3A to 3F and FIGS. 13A to 13E can include same materials, and repetitive details may be omitted in the interest of brevity. In some embodiments, a substrate 400 can be received. The substrate 400 can be the substrate 102 shown in FIG. 1, but the disclosure is not limited thereto. In some embodiments, the substrate 400 can include a semiconductor device, such as the transistor shown in FIG. 1, but the disclosure is not limited thereto. As shown in FIG. 13A, the substrate 400 may include a conductive feature 402 disposed therein. In some embodiments, the conductive feature 402 can be a FEOL feature similar to the metal gate 110 or the source/drain region S/D depicted in FIG. 1. In some embodiments, the conductive feature 402 can be a MEOL feature, such as a cobalt-containing device-level contact similar to the connecting structures 130, 132 depicted in FIG. 1. In other embodiments, the conductive feature 402 can be a BEOL feature, such as the cobalt-containing line of a metal line (M) feature 150 depicted in FIG. 1.

In operation 31, a dielectric structure 410 is formed over the substrate 400 and the conductive feature 402. In some embodiments, the dielectric structure 410 can include a single layer. In some embodiments, the dielectric structure can include a multilayered structure. For example, as shown in FIG. 13A, the dielectric structure 410 can include at least a first dielectric layer 412 and a second dielectric layer 414 sequentially stacked over the substrate 400 and the conductive feature 402. The first dielectric layer 412 and the second dielectric layer 414 can include different dielectric materials.

In operation 31, an opening can be formed in the dielectric structure 410. In some embodiments, the opening penetrates the dielectric structure 410 from a top surface 410t to a bottom of the dielectric structure 410. Accordingly, a portion of the conductive feature 402 is exposed through the opening.

Still referring to FIG. 13A, in operation 32, a metal layer 420, such as a noble metal layer, can be formed to fill the opening. The metal layer 420 extends from the top surface 410t of the dielectric structure 410 to the bottom of the dielectric structure 410. The metal layer 420 penetrates the second dielectric layer 414 and the first dielectric layer 412 to contact the exposed portion of the conductive feature 402. Further, the metal layer 420 covers the top surface 410t of the dielectric structure 410. It should be noted that, in some embodiments, the metal layer 420 can be formed in absence of a liner, a barrier, a seed layer or any intervening layer. Therefore, in such embodiments, the metal layer 420 can be in contact with the dielectric structure 410, but the disclosure is not limited thereto.

Figure 13B:
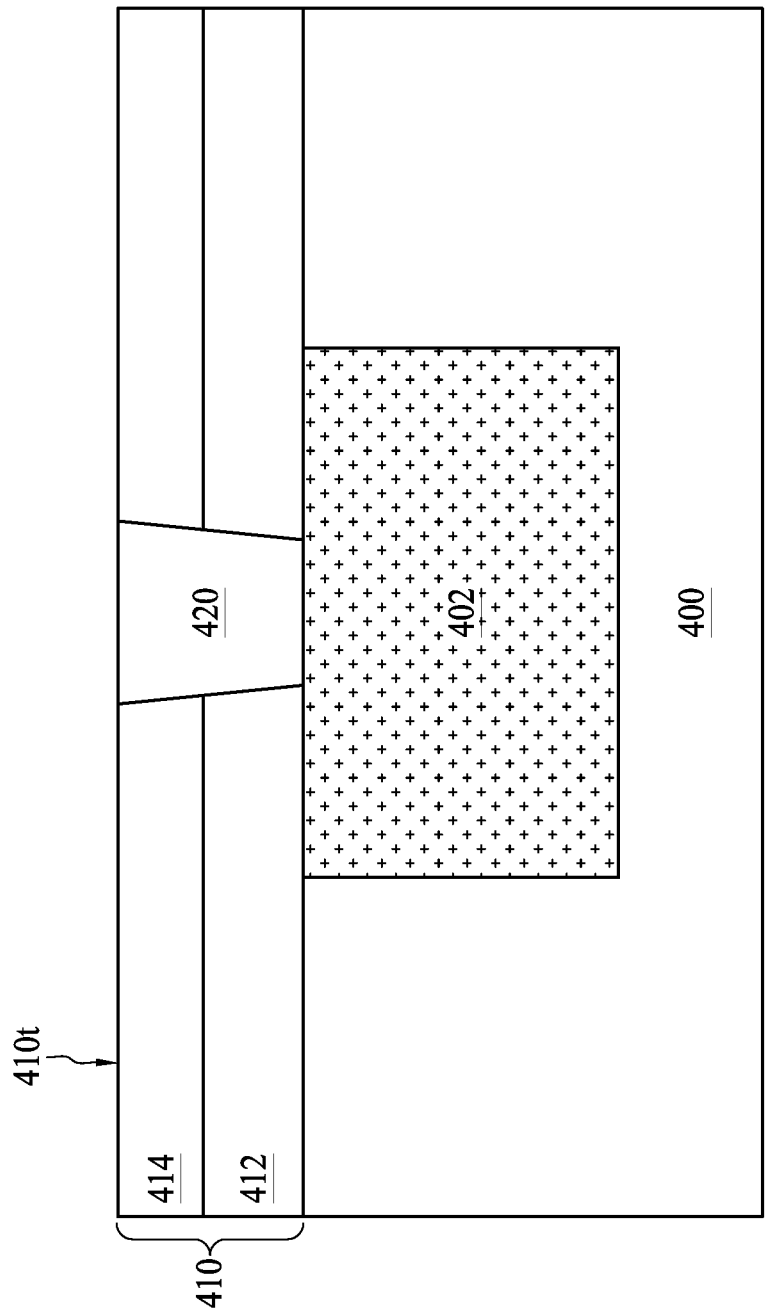

Referring to FIG. 13B, in operation 33, a portion of the metal layer 420 is removed to expose the top surface 410t of the dielectric structure 410 and form a connecting structure 440. In some embodiments, a portion of the dielectric structure 410, such as a portion of the second dielectric layer 414, can be removed in operation 33. In some embodiments, the removal of the portion of the metal layer 420 and the portion of the dielectric structure 410 can be performed using a CMP operation.

Figure 13C:
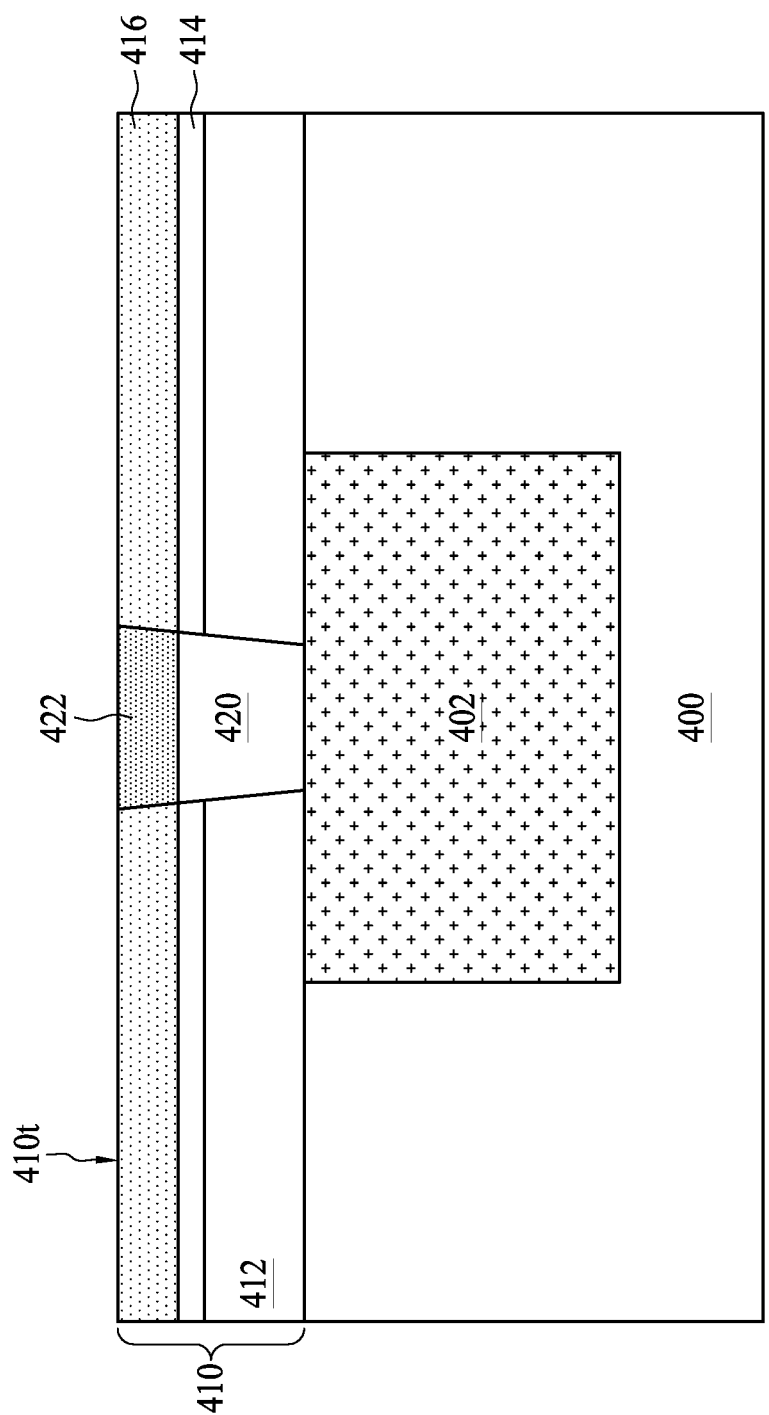

Referring to FIG. 13C, in operation 34, a doped metal portion 422 is formed in the metal layer 420 and a doped dielectric layer 416 is formed in the second dielectric layer 414 of the dielectric structure 410. In some embodiments, the doped metal portion 422 and the doped dielectric layer 416 are aligned with each other, but the disclosure is not limited thereto. In some embodiments, the doped metal portion 422 and the doped dielectric layer 416 include dopants such as germanium (Ge), silicon (Si), argon (Ar), xenon (Xe), or nitrogen (N), but the disclosure is not limited thereto. In some embodiments, the forming of the doped metal portion 422 and the doped dielectric layer 416 includes an ion implantation. A dosage of the ion implantation can be between approximately $1E13$ $cm^{-2}$ and approximately $1E16$ $cm^{-2}$. An angle of the ion implantation can be between approximately 0 degrees and approximately 60 degrees. In some embodiments, a temperature of the ion implantation can be between approximately −100° C. and approximately 500° C. In some embodiments, a concentration of the dopants in the doped dielectric layer 416 can be between approximately $1E19$ atom/$cm^3$ and approximately $1E12$ atom/$cm^3$, but the disclosure is not limited thereto. In some embodiments, a concentration of the dopants in the doped metal portion 422 can be between approximately $1E19$ atom/$cm^3$ and approximately $1E12$ atom/$cm^3$, but the disclosure is not limited thereto.

Figure 14:
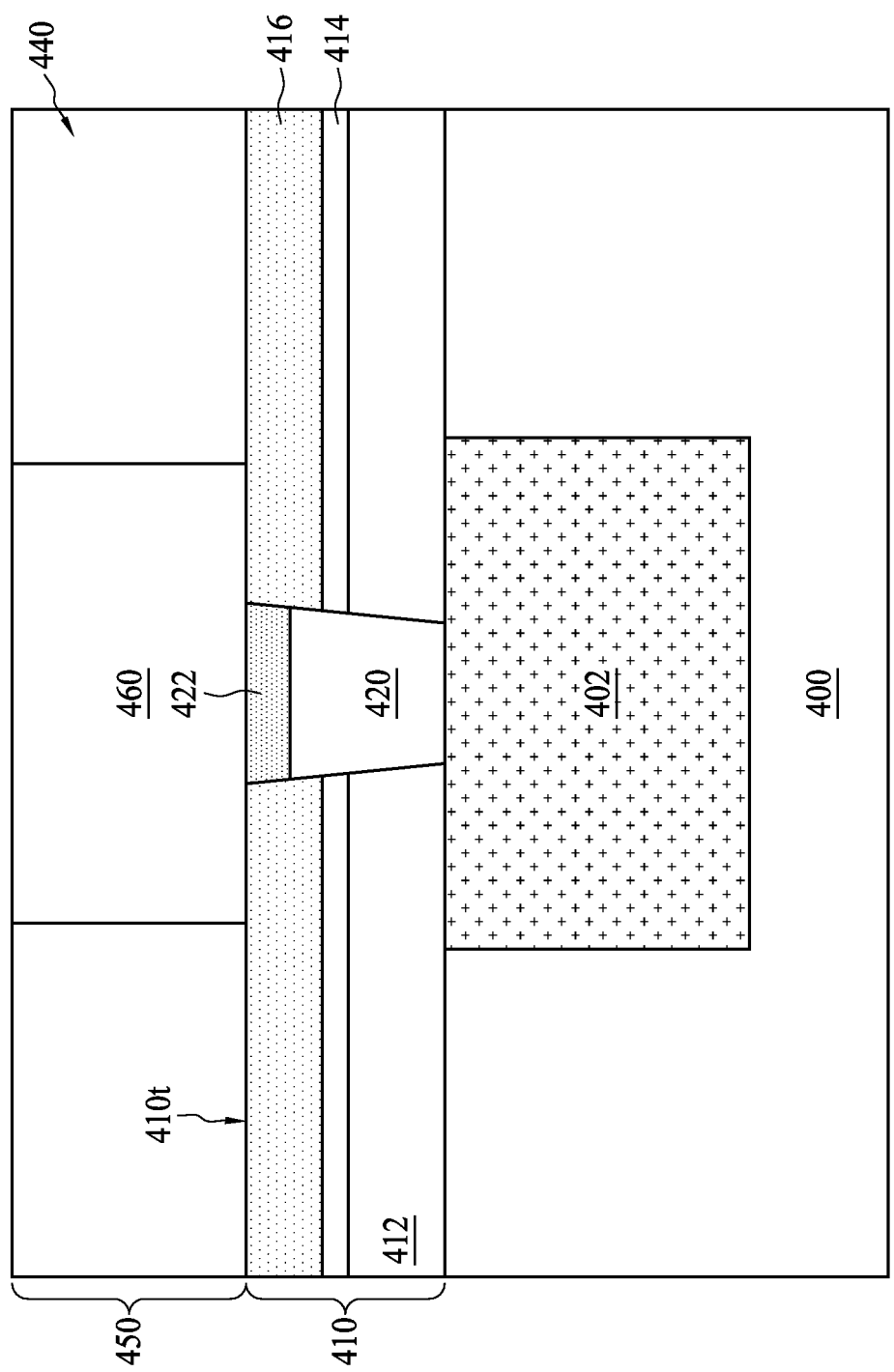
FIG. 14 is a schematic drawing illustrating a connecting structure according to aspects of one or more embodiments of the present disclosure.
Figure 15:
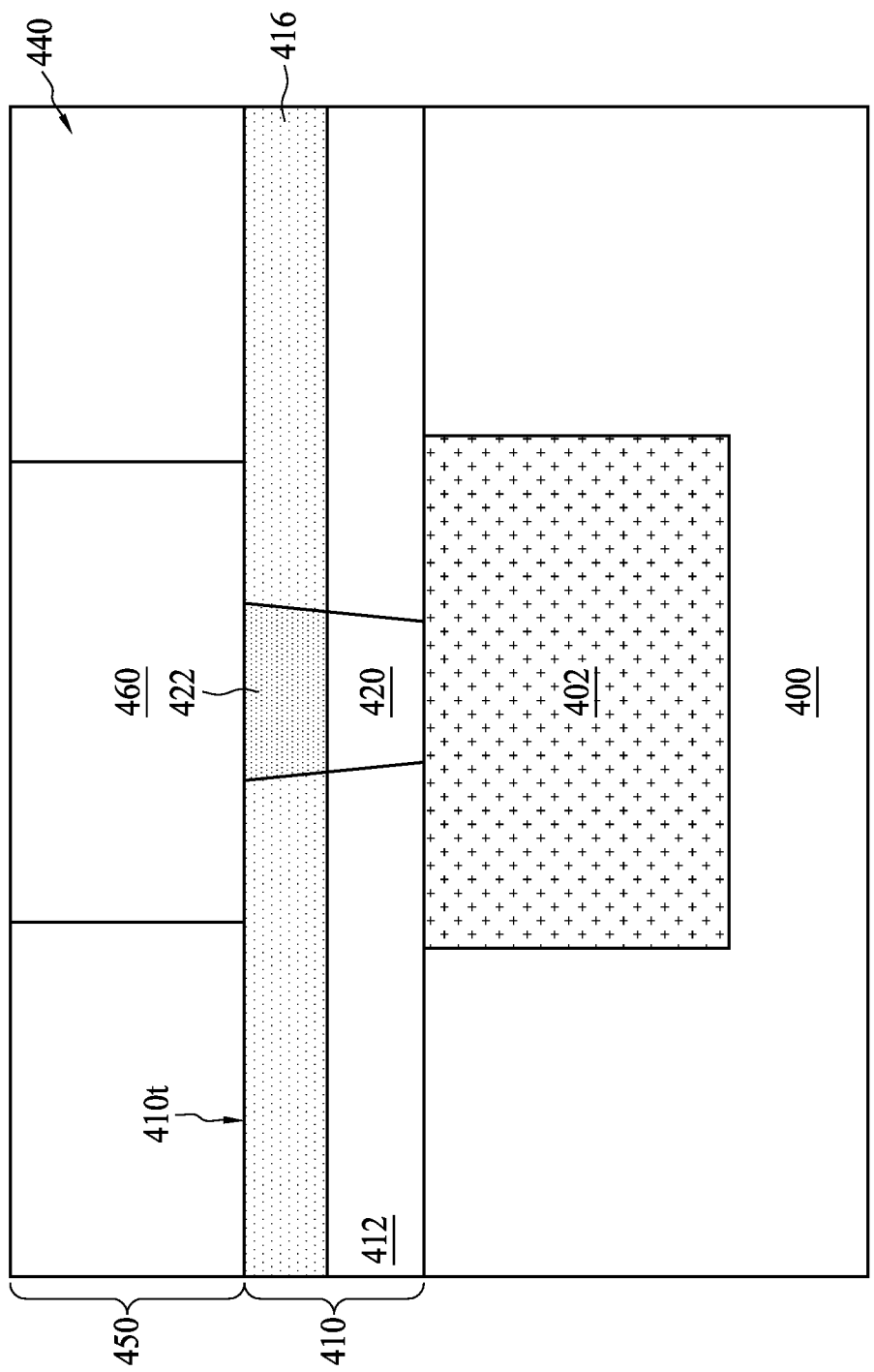
FIG. 15 is a schematic drawing illustrating a connecting structure according to aspects of one or more embodiments of the present disclosure.
Figure 16:
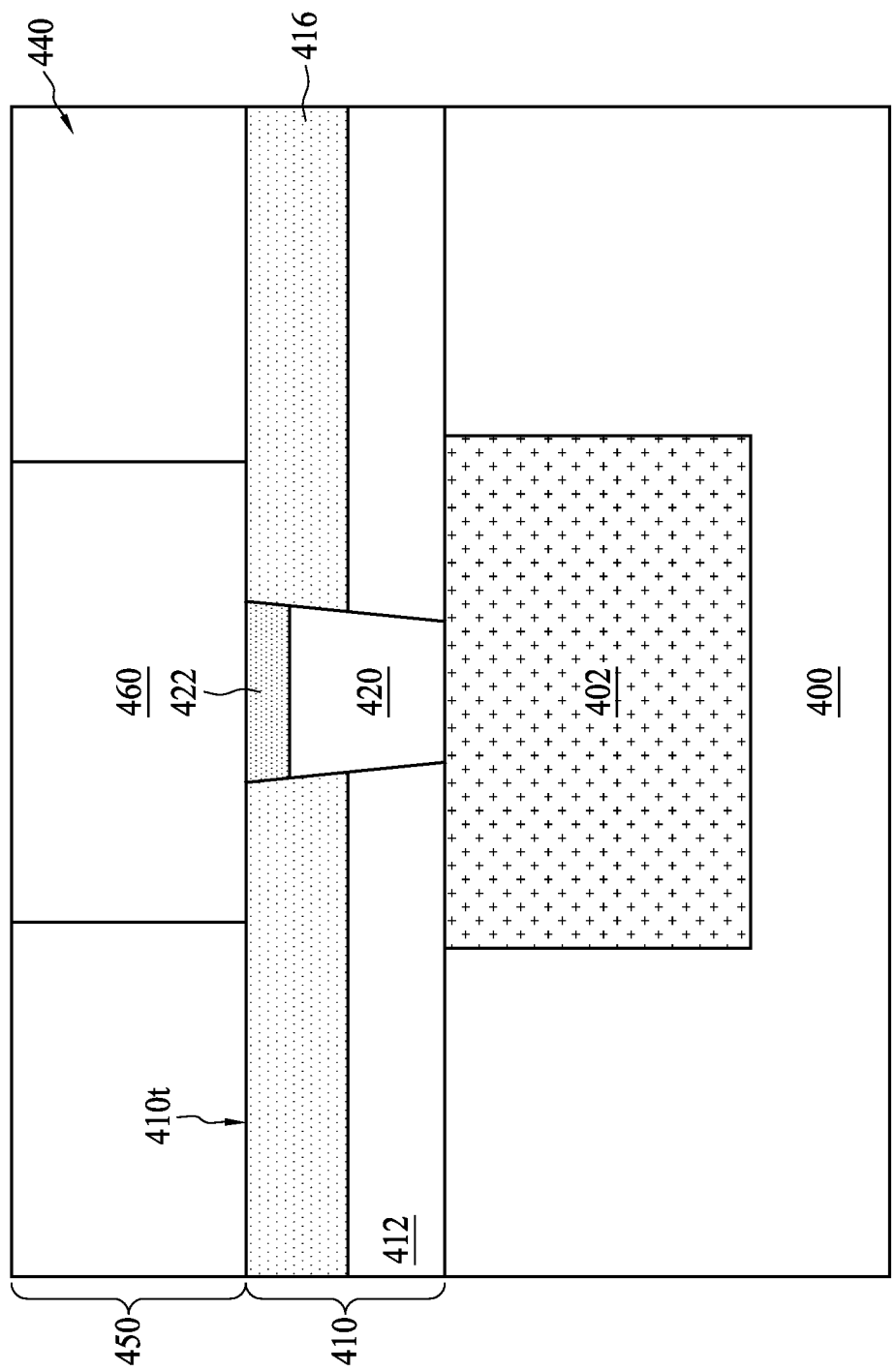
FIG. 16 is a schematic drawing illustrating a connecting structure according to aspects of one or more embodiments of the present disclosure.
Figure 17:
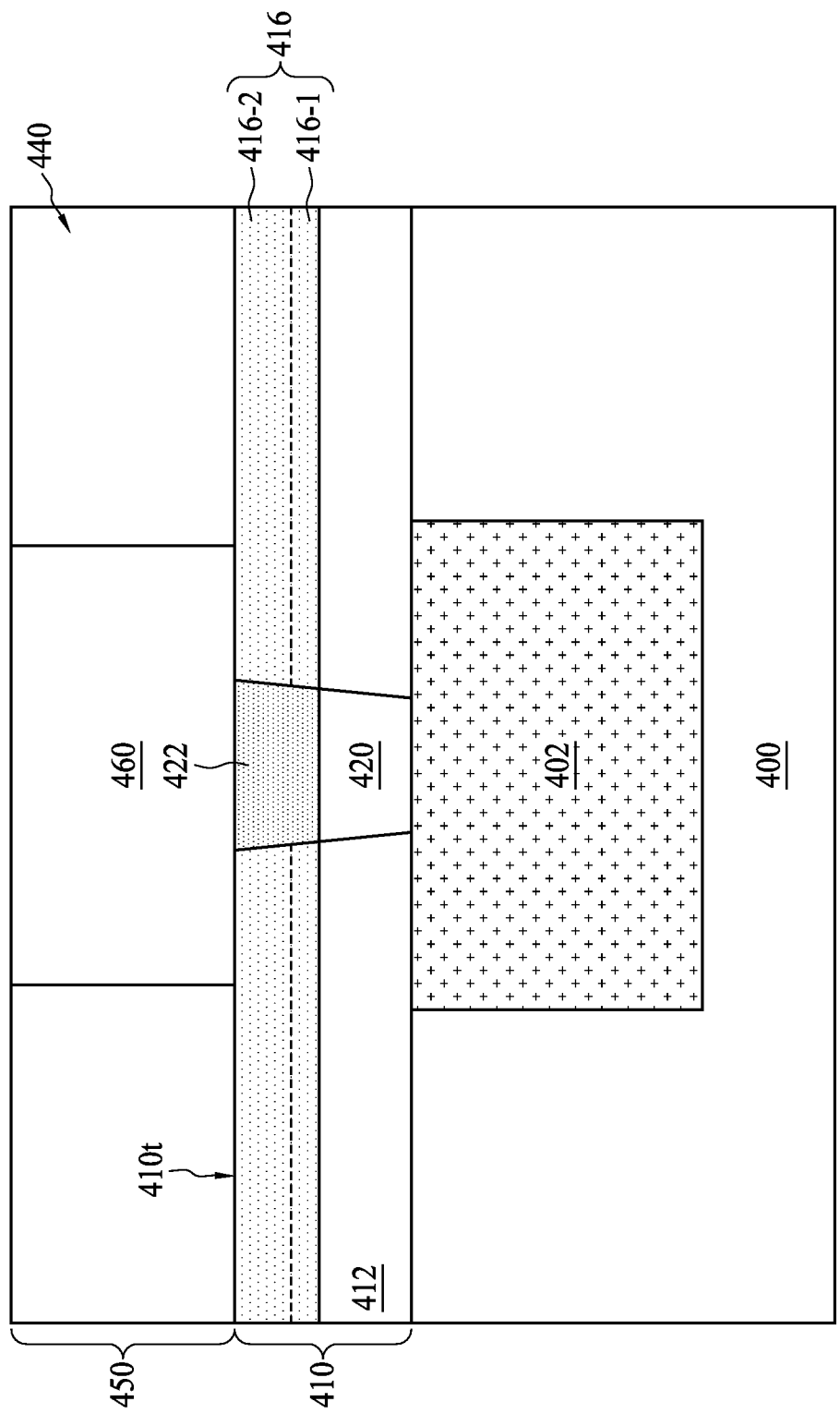
FIG. 17 is a schematic drawing illustrating a connecting structure according to aspects of one or more embodiments of the present disclosure.
Figure 18:
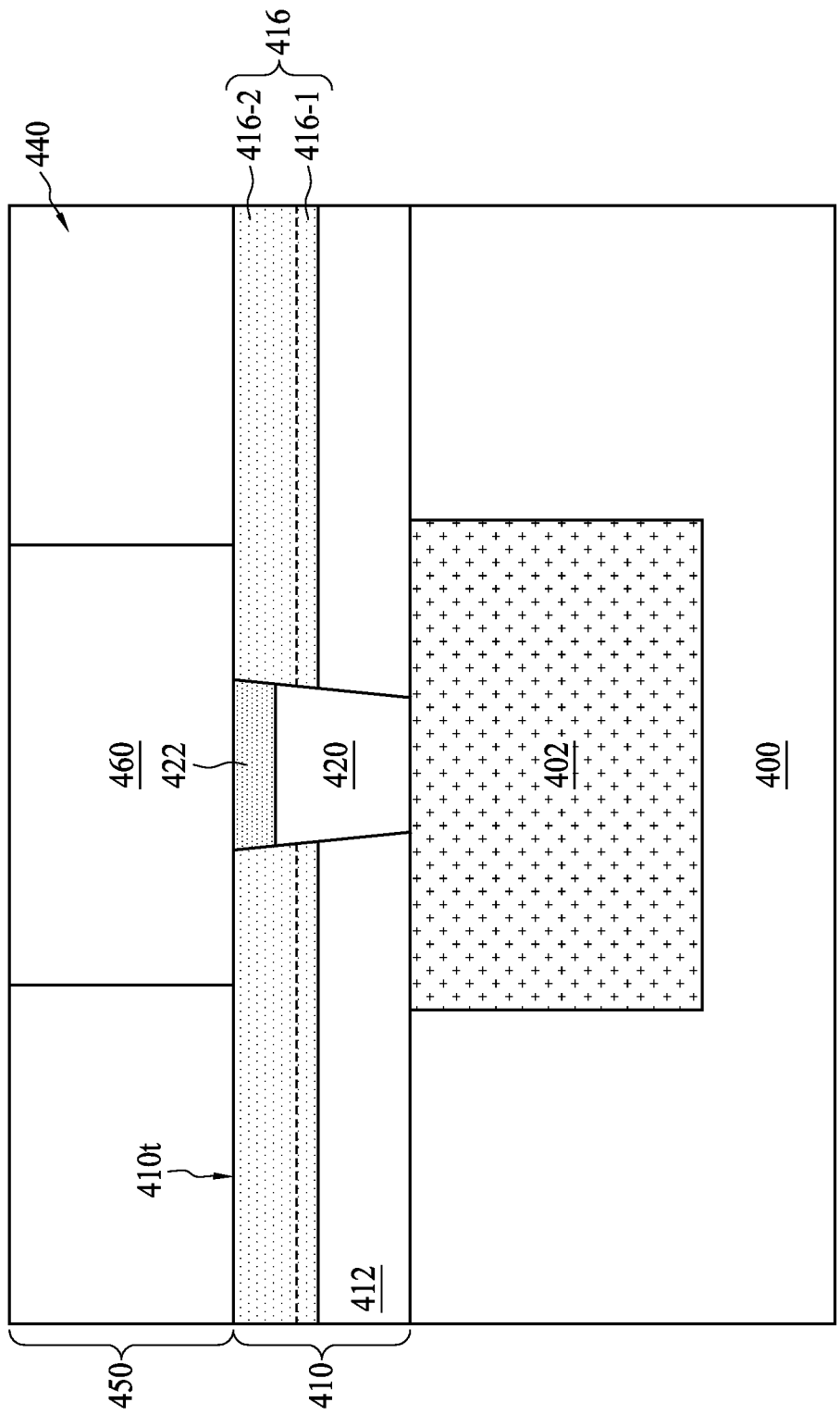
FIG. 18 is a schematic drawing illustrating a connecting structure according to aspects of one or more embodiments of the present disclosure.

It should be noted that depths or locations where the doped metal portion 422 and the doped dielectric layer 416 are formed can be determined by an implantation energy of the ion implantation. For example, by adjusting the implantation energy, a bottom surface of the doped dielectric layer 416 can be formed to contact the second dielectric layer 414 as shown in FIGS. 13C and 14, to contact a top surface of the first dielectric layer 412 as shown in FIGS. 15 and 16, or be lower than the top surface of the first dielectric layer 412 as shown in FIGS. 17 and 18. In some embodiments, as shown in FIG. 13C, a top surface of the doped metal portion 422 and a top surface of the doped dielectric layer 416 are exposed. However, it should be noted that by controlling or adjusting the implantation energy of the ion implantation, the doped metal portion 422 is separated from the conductive feature 402. In some comparative approaches, when the doped metal portion 422 is in contact with the conductive feature 402, the resistance of the conductive feature 402 may be negatively affected.

Figure 13D:
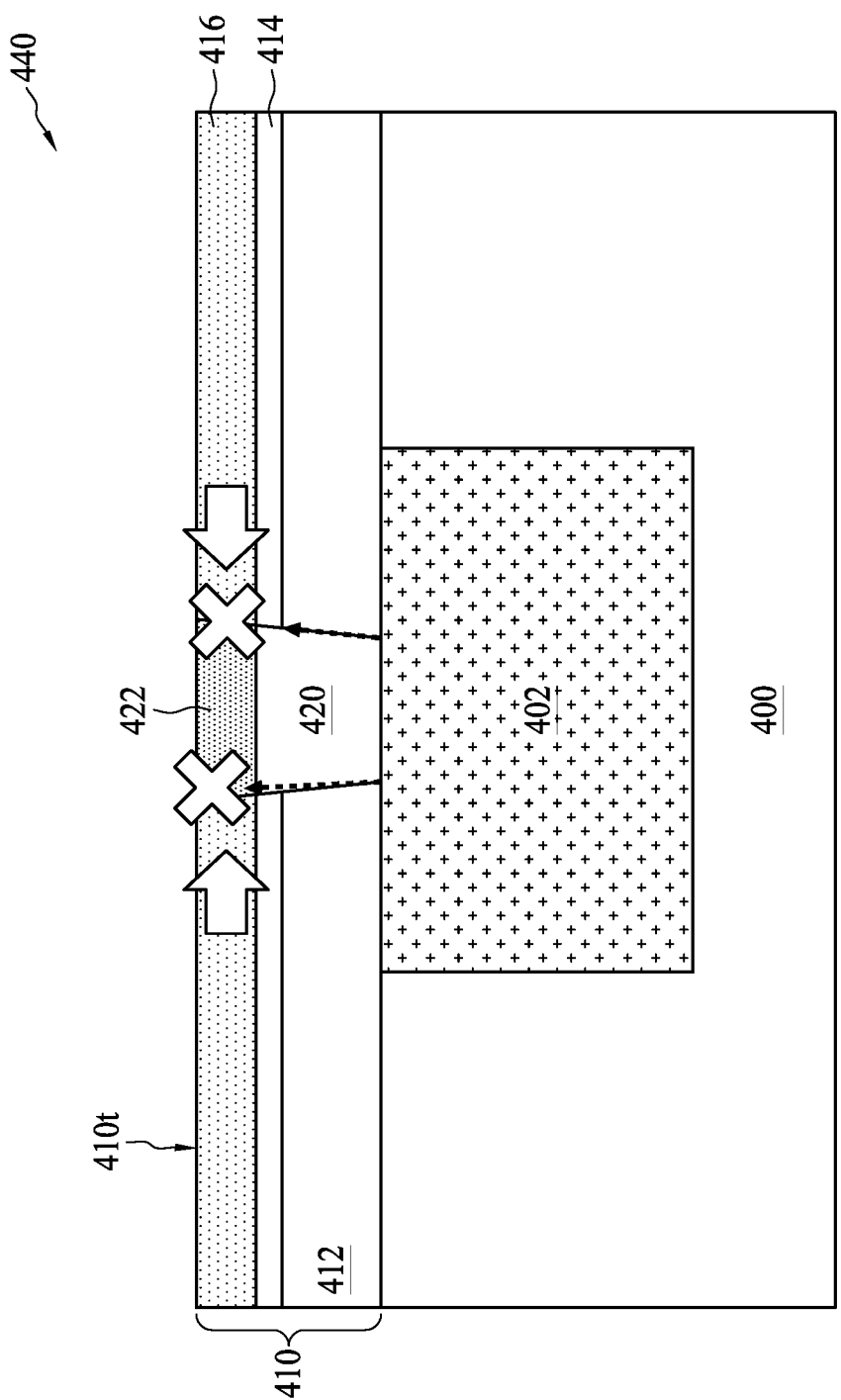

Referring to FIG. 13D, in some embodiments, an anneal ranging from approximately 100° C. to approximately 500° C. is performed to improve the gap-filling results, reduce plug resistance and improve an interface quality. During the anneal, metal diffusion may occur, and metal ions may move from the conductive feature 402 to an upper portion of the metal layer 420 along the interface between the dielectric structure 410 and the metal layer 420. As mentioned above, the dopants in the doped dielectric layer 416 makes the doped dielectric layer 416 serves as a compressive stress layer. The compressive stress from the doped dielectric layer 416 as indicated by the opposing arrows along the sidewalls of the doped metal portion 422 that helps to obstruct or reduce the metal diffusion by the "X" and upward arrows, as shown in FIG. 13D. Therefore, the metal-loss issue can be mitigated or reduced.

Figure 13E:
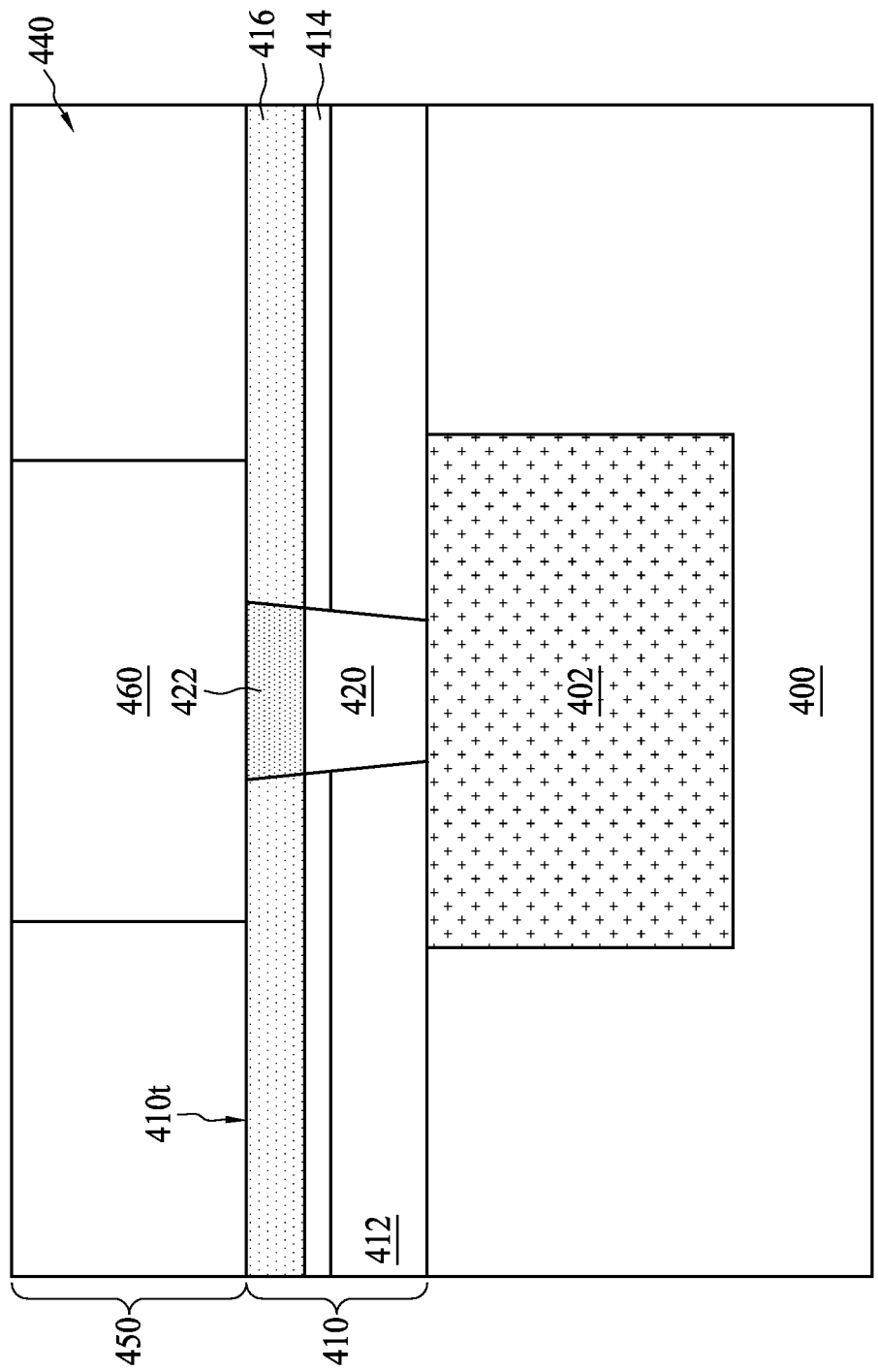

Referring to FIG. 13E, in some embodiments, another dielectric structure 450 can be formed over the dielectric structure 410 and the connecting structure 440. Another conductive feature 460 can be formed in the dielectric structure 450. The conductive feature 460 can be coupled to the connecting structure 440. In some embodiments, the conductive feature 460 can be referred to as the connecting structures 140, 142 in FIG. 1. In some embodiments, the conductive feature 460 can be referred to as the metal line 150 in FIG. 1.

Accordingly, a connecting structure 440 is obtained. As shown in FIG. 13D, the connecting structure 440 includes the first dielectric layer 412 over the substrate 400 and the conductive feature 402, the second dielectric layer 414 over the first dielectric layer 412, the doped dielectric layer 416 over the second dielectric layer 412, the metal layer 420 disposed over the conductive feature 402 and referred to as a metal portion, and the doped metal portion 422 over the metal portion 420. As shown in FIG. 13D, the metal portion 420 is in contact with the conductive feature 402, the first dielectric layer 412 and the second dielectric layer 414, while the doped metal portion 422 is in contact with the doped dielectric layer 416. A top surface of the doped metal portion 422 is aligned with a top surface of the doped dielectric layer 416. In such embodiments, a bottom surface of the doped dielectric layer 416 is in contact with the second dielectric layer 414. Additionally, the bottom surface of the doped dielectric layer 416 and a bottom surface of the doped metal portion 422 may be aligned, but the disclosure is not limited thereto.

In some embodiments, the metal portion 420 and the doped metal portion 422 include a same metal material. The doped dielectric layer 416 and the second dielectric layer 414 include a same dielectric material. Further, the doped metal portion 422 and the doped dielectric layer 416 include same dopants.

As mentioned above, during the ion implantation, the dopants in the dielectric structure 410 may penetrate deeper than the dopants in the metal layer 420 because the dielectric materials are less dense than the metal material. Therefore, a bottom surface of the doped dielectric layer 416 may be lower than a bottom surface of the doped metal portion 422, as shown in FIG. 14.

Additionally, in some embodiments, the peak of the distribution curve of the dopants in the doped metal portion 422 may be observed below the top surface of the doped metal portion 422, but the disclosure is not limited thereto. For example, in some embodiments, the peak of the distribution curve of the dopants in the doped metal portion 422 may be observed at the top surface of the doped metal portion 422. In some embodiments, the peak of the distribution curve of the dopants in the doped dielectric layer 416 may be observed below the top surface of the doped dielectric layer 416, but the disclosure is not limited thereto. For example, in some embodiments, the peak of the distribution curve of the dopants in the doped dielectric layer 416 may be observed at the top surface of the doped dielectric layer 416.

As mentioned above, in some embodiments, by adjusting the implantation energy, a bottom surface of the doped dielectric layer 416 can be formed to contact the first dielectric layer 412, as shown in FIGS. 15 and 16. In such embodiments, the doped dielectric layer 416 and the first dielectric layer 412 may include different dielectric materials.

As mentioned above, during the ion implantation, the dopants in the dielectric structure 410 may penetrate deeper than the dopants in the metal layer 420 because the dielectric materials has less density than the metal material. Therefore, a bottom surface of the doped dielectric layer 416 may be lower than a bottom surface of the doped metal portion 422, as shown in FIG. 16.

As mentioned above, in some embodiments, the doped dielectric layer 416 can be formed by implanting the dopants into the first dielectric layer 412 and the second dielectric layer 414. Accordingly, the doped dielectric layer 416 may include two portions. As shown in FIGS. 17 and 18, the doped dielectric layer 416 can include a first portion 416-1 including a first dielectric material same as that of the first dielectric layer 412, and a second portion 416-2 including a second dielectric material same as that of the second dielectric layer 414.

As mentioned above, during the ion implantation, the dopants in the dielectric structure 410 may penetrate deeper than the dopants in the metal layer 420 because the dielectric materials has less density than the metal material. Therefore, a bottom surface of the doped dielectric layer 416 may be lower than a bottom surface of the doped metal portion 422, as shown in FIG. 18.

Further, referring to FIGS. 14 to 18, in some embodiments, another dielectric structure 450 can be formed over the dielectric structure 410 and the connecting structure 440. Another conductive feature 460 can be formed in the dielectric structure 450. The conductive feature 460 can be coupled to the connecting structure 440. In some embodiments, the conductive feature 460 can be referred to as the connecting structures 140, 142 in FIG. 1. In some embodiments, the conductive feature 460 can be referred to as the metal line 150 in FIG. 1.

According to the method for forming the connecting structure 30, the doped metal portion 422 and the doped dielectric layer 416 can be formed after the removal of the portion of the metal layer 420 and the portion of the second dielectric layer 414. The doped dielectric layer 416 provides a compressive stress, such that the metal diffusion can be obstructed, and the metal-loss issue can be mitigated. As mentioned above, although the depths and the locations of the doped dielectric layer 416 and the doped metal portion 422 can be determined by adjusting the implantation energy, it should be noted that the bottom surface of the doped metal portion 422 is formed separate from the conductive feature 402 and the bottom surface of the doped dielectric layer 416 is formed separate from the substrate 400, in order to prevent negative effect on the resistance of the conductive feature 402 and the resistance of the substrate 400.

In summary, the present disclosure therefore provides a connecting structure and a method for forming a connecting structure to mitigate the bottom metal-loss issue. In some embodiments, an ion implantation is performed after the depositing of the metal layer to form a doped dielectric layer serving as a compressive stress layer that provides a compressive stress, and the compressive stress helps to obstruct the metal diffusion. Accordingly, the bottom metal-loss issue caused by metal diffusion can be mitigated.

In some embodiments, a connecting structure is provided. The connecting structure includes a first dielectric layer disposed over a conductive feature, a doped dielectric layer disposed over the first dielectric layer, and a metal portion disposed in the first dielectric layer and the doped dielectric layer. In some embodiments, the doped dielectric layer includes a compressive stress to the metal portion. In some embodiments, the metal portion is in contact with the conductive feature, the doped dielectric layer and the first dielectric layer. In some embodiments, a top surface of the metal portion and a top surface of the doped dielectric layer are aligned. In some embodiments, the first dielectric layer includes a first dielectric material, and at least a portion of the doped dielectric layer includes a second dielectric material different from the first dielectric material.

In some embodiments, a connecting structure is provided. The connecting structure includes a first dielectric layer disposed over a conductive feature, a doped dielectric layer disposed over the first dielectric layer, a metal portion disposed in the first dielectric layer and the doped dielectric layer, and a doped metal portion disposed over the metal portion. In some embodiments, the doped dielectric layer includes a compressive stress to the doped metal portion. In some embodiments, a top surface of the doped metal portion and a top surface of the doped dielectric layer are aligned. In some embodiments, a bottom surface of the doped metal portion is higher than a bottom surface of the doped dielectric layer. In some embodiments, the first dielectric layer includes a first dielectric material, and at least a portion of the doped dielectric layer includes a second dielectric material different from the first dielectric material.

In some embodiments, a method for forming a connecting structure is provided. The method includes following operations. A dielectric structure is formed over a conductive feature. The dielectric structure includes an opening exposing a portion of the conductive feature. The opening is filled with a metal layer. A doped metal portion is formed in the metal layer and a doped dielectric layer is formed in the dielectric structure. In some embodiments, the doped dielectric layer includes a compressive stress to the doped metal portion. In some embodiments, a top surface of the doped metal portion is separated from a top surface of the metal layer, and a top surface of the dielectric layer is separated from a top surface of the dielectric structure. A portion of the metal layer and a portion of the dielectric structure are removed to form the connecting structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
   forming a dielectric structure over a conductive feature, wherein the dielectric structure comprises an opening exposing a portion of the conductive feature;
   filling the opening with a metal layer;
   forming a doped metal portion in the metal layer and a doped dielectric layer in the dielectric structure, wherein the doped dielectric layer exerts a compressive force on the doped metal portion, wherein an undoped metal portion of the metal layer and an undoped dielectric portion of the dielectric structure remain after forming the doped metal portion and the doped dielectric layer, wherein the undoped metal portion is more distal from the conductive feature than the doped metal portion, wherein the undoped dielectric portion is more distal from the conductive feature than the doped dielectric layer; and
   removing at least a portion of the metal layer and at least a portion of the dielectric structure to form a connecting structure.

2. The method of claim 1, wherein the doped metal portion and the doped dielectric layer comprise same dopants, wherein the dopants comprise germanium, silicon, argon, xenon, arsenic, or a combination thereof.

3. The method of claim 1, wherein removing at least the portion of the metal layer and at least the portion of the dielectric structure is performed after the forming of the doped metal portion and the doped dielectric layer.

4. The method of claim 3, wherein the doped metal portion is entirely removed during the removing of the portion of the metal layer and the portion of the dielectric structure.

5. The method of claim 1, wherein forming the dielectric structure comprises:
   forming a first dielectric layer of a first dielectric material over the conductive feature; and
   forming a second dielectric layer of a second dielectric material over the first dielectric layer, wherein the first dielectric material is different than the second dielectric material.

6. The method of claim 5, wherein, after forming the doped dielectric layer, a portion of the second dielectric layer is between the doped dielectric layer and the first dielectric layer.

7. The method of claim 5, wherein forming the doped dielectric layer comprises doping the second dielectric layer and at least a portion of the first dielectric layer.

8. The method of claim 1, wherein forming the doped metal portion in the metal layer and the doped dielectric layer in the dielectric structure comprises doping the metal layer to a different depth than doping the dielectric structure.

9. The method of claim 8, wherein a bottom of the doped metal portion is higher than a bottom of the doped dielectric layer.

10. A method for forming a semiconductor device, the method comprising:
    forming a first dielectric layer over a conductive feature, the first dielectric layer comprises a first dielectric material;
    forming a second dielectric layer over the first dielectric layer, the second dielectric layer comprises a second dielectric material;
    forming an opening through the first dielectric layer and the second dielectric layer, wherein the opening exposes the conductive feature;
    forming a metal layer in the opening; and
    doping at least a portion of the second dielectric layer to form a doped dielectric layer and the metal layer to form a doped metal layer, wherein after doping at least a portion of the second dielectric layer remains undoped over the doped dielectric layer, wherein after doping at least a portion of the metal layer remains undoped over the doped metal layer.

11. The method of claim 10, wherein the doped dielectric layer contacts the first dielectric layer.

12. The method of claim 10, wherein doping at least a portion of the second dielectric layer comprises doping at least a portion of the first dielectric layer.

13. The method of claim 10, wherein forming the metal layer comprises forming the metal layer over an upper surface of the second dielectric layer, and further comprising removing a portion of the metal layer, wherein after removing a portion of the metal layer, an upper surface of the metal layer is level with an upper surface of the second dielectric layer.

14. The method of claim 9, wherein a bottom of the doped dielectric layer is closer to the conductive feature than a bottom of the doped metal layer.

15. A method for forming a semiconductor device, the method comprising:
    forming a first dielectric layer over a conductive feature, the first dielectric layer comprises a first dielectric material;
    forming a second dielectric layer over the first dielectric layer, the second dielectric layer comprises a second dielectric material;
    forming an opening through the first dielectric layer and the second dielectric layer, wherein the opening exposes the conductive feature;
    forming a metal layer over the second dielectric layer and in the opening;
    removing a portion of the metal layer over the second dielectric layer; and
    doping at least a portion of the second dielectric layer to form a doped dielectric layer and at least a portion of the metal layer to form a doped metal layer, wherein a portion of the second dielectric layer over the doped dielectric layer remains undoped after doping, wherein a portion of the metal layer over the doped metal layer remains undoped after doping.

16. The method of claim 15, wherein doping at least a portion of the second dielectric layer comprises doping only a portion of the second dielectric layer.

17. The method of claim 15, wherein a first distance from the conductive feature to the doped metal layer is different than a second distance from the conductive feature to the doped dielectric layer.

* * * * *

UNITED STATES PATENT AND TRADEMARK OFFICE
CERTIFICATE OF CORRECTION

PATENT NO. : 11,791,204 B2
APPLICATION NO. : 17/171210
DATED : October 17, 2023
INVENTOR(S) : Chen et al.

Page 1 of 1

It is certified that error appears in the above-identified patent and that said Letters Patent is hereby corrected as shown below:

In the Claims

In Column 20, in Claim 14, Line 34, delete "claim 9," and insert -- claim 10, --.

Signed and Sealed this
Twenty-sixth Day of December, 2023

Katherine Kelly Vidal
*Director of the United States Patent and Trademark Office*